US00RE50306E

(19) United States
(12) Reissued Patent
Nam et al.

(10) Patent Number: US RE50,306 E
(45) **Date of Reissued Patent: *Feb. 18, 2025**

(54) MEMORY DEVICE CONFIGURED TO ALTERNATELY APPLY AN ERASE VOLTAGE AND AN INHIBIT VOLTAGE

(71) Applicant: SAMSUNG ELECTRONICS CO., LTD., Suwon-si (KR)

(72) Inventors: Sang Wan Nam, Hwaseong-si (KR); Yong Hyuk Choi, Suwon-si (KR); Jun Yong Park, Seoul (KR); Jung No Im, Suwon-si (KR)

(73) Assignee: Samsung Electronics Co., Ltd. (KR)

( * ) Notice: This patent is subject to a terminal disclaimer.

(21) Appl. No.: 17/666,283

(22) Filed: Feb. 7, 2022

Related U.S. Patent Documents

Reissue of:
(64) Patent No.: 10,892,017
Issued: Jan. 12, 2021
Appl. No.: 16/508,016
Filed: Jul. 10, 2019

(30) Foreign Application Priority Data

Sep. 28, 2018 (KR) ..... 10-2018-0116555

(51) Int. Cl.
*G11C 11/34* (2006.01)
*G06F 12/02* (2006.01)
(Continued)

(52) U.S. Cl.
CPC ..... *G11C 16/14* (2013.01); *G11C 7/1006* (2013.01); *G11C 16/0483* (2013.01); *G11C 16/26* (2013.01); *G06F 12/02* (2013.01)

(58) Field of Classification Search
CPC ... G11C 16/14; G11C 16/0483; G11C 29/025; G11C 8/08; G11C 7/1006;
(Continued)

(56) References Cited

U.S. PATENT DOCUMENTS 4,377,857 A * 3/1983 Tickle ..... G11C 16/3486 365/185.26
5,652,722 A * 7/1997 Whitefield ..... G11C 16/30 365/189.11
(Continued)

FOREIGN PATENT DOCUMENTS

KR 10-2015-0116351 10/2015
KR 10-2018-0062836 6/2018
KR 10-2016-0108837 9/2019

OTHER PUBLICATIONS

Office Action in Korean Appln. No. 10-2018-0116555, mailed on Mar. 16, 2023, 20 pages (with English translation).
(Continued)

*Primary Examiner* — B. James Peikari
(74) *Attorney, Agent, or Firm* — Fish & Richardson P.C.

(57) ABSTRACT

[A memory device comprises: a first memory cell, and a second memory cell different from the first memory cell, wherein the first memory cell and the second memory cell are included in same memory block; a first word line connected to the first memory cell; a second word line, different from the first word line, connected to the second memory cell; an address decoder which applies one of an erase voltage and an inhibit voltage different from the erase voltage to each of the first and second word lines; and a control logic which controls an erasing operation on the memory block, using the address decoder, wherein while the erasing operation on the memory block is executed, the inhibit voltage is applied to the first word line after the erase voltage is applied, and the erase voltage is applied to the second word line after the inhibit voltage is applied.] *The present disclosure provides a memory device for detecting a word line bridge defect through erase verification of the memory device. The memory device comprises: a first memory cell and a second memory cell; a first word line*
(Continued)

*connected to the first memory cell; a second word line connected to the second memory cell; an address decoder which is configured to apply one of an erase voltage and an inhibit voltage to each of the first and second word lines; and a control logic which is configured to control an erasing operation on the memory block, using the address decoder, wherein while the erasing operation on the memory block is executed, the inhibit voltage is applied to the first word line after the erase voltage is applied, and the erase voltage is applied to the second word line after the inhibit voltage is applied.*

21 Claims, 23 Drawing Sheets

(51) Int. Cl.
*G11C 7/10* (2006.01)
*G11C 16/04* (2006.01)
*G11C 16/14* (2006.01)
*G11C 16/26* (2006.01)

(58) Field of Classification Search
CPC ..... G11C 16/3445; G11C 16/16; G11C 16/08; G11C 11/5635; G11C 16/26; G11C 2029/1202; G11C 11/5671; G11C 16/32; G11C 16/30; G06F 12/02
See application file for complete search history.

(56) References Cited

U.S. PATENT DOCUMENTS 5,748,538 A * 5/1998 Lee ..... G11C 11/5628 257/E27.103
6,400,624 B1 * 6/2002 Parker ..... G11C 11/5621 365/201
6,687,157 B1 * 2/2004 Liu ..... G11C 29/36 365/201
8,493,781 B1 * 7/2013 Meir ..... G11C 11/5628 365/185.01
8,908,431 B2 * 12/2014 Shim ..... G11C 16/10 365/185.02
9,478,290 B1 10/2016 Nam et al.
9,508,441 B1 * 11/2016 Nam ..... G11C 16/0483
9,514,827 B1 * 12/2016 Nam ..... G11C 16/16
9,583,201 B1 * 2/2017 Lee ..... G11C 16/3459
9,697,901 B2 * 7/2017 Nam ..... G11C 16/0483
9,785,493 B1 * 10/2017 Zhang ..... G11C 16/3431
9,842,659 B2 12/2017 Nam et al.
10,304,551 B2 * 5/2019 Ray ..... G11C 16/0483
10,346,088 B2 * 7/2019 Righetti ..... G11C 16/16
10,438,666 B2 10/2019 Park et al.
10,720,218 B2 7/2020 Park et al.
10,892,017 B2 1/2021 Nam et al.
10,964,398 B2 3/2021 Nam et al.
2005/0047216 A1 * 3/2005 Kojima ..... G11C 16/3495 365/185.33
2006/0170028 A1 8/2006 Jeon et al.
2006/0256629 A1 * 11/2006 Roohparvar ..... G11C 29/808 365/200
2009/0063918 A1 3/2009 Chen et al.
2009/0147582 A1 * 6/2009 Aritome ..... G11C 16/16 365/185.11
2011/0286279 A1 * 11/2011 Lei ..... G11C 16/3404 365/185.19
2012/0224427 A1 * 9/2012 Takekida ..... G11C 16/0483 365/185.11
2013/0163360 A1 * 6/2013 Seo ..... G11C 16/0483 365/203
2015/0078087 A1 3/2015 Shim et al.
2015/0098274 A1 4/2015 Rhie
2015/0117105 A1 4/2015 Jung et al.
2015/0117118 A1 * 4/2015 Shim ..... G11C 16/14 365/185.29
2015/0270005 A1 9/2015 Choi et al.
2015/0287479 A1 10/2015 Nam et al.
2016/0049201 A1 * 2/2016 Lue ..... G11C 16/16 365/185.11
2016/0118136 A1 * 4/2016 Tseng ..... G11C 16/349 365/185.03
2016/0141043 A1 * 5/2016 Lee ..... G11C 16/08 365/185.11
2016/0260490 A1 * 9/2016 Lee ..... H01L 27/11582
2016/0260733 A1 * 9/2016 Lue ..... H01L 29/66742
2016/0267995 A1 9/2016 Chang et al.
2017/0316834 A1 11/2017 Huynh et al.
2017/0323900 A1 11/2017 Kanamori
2017/0345506 A1 * 11/2017 Tanzawa ..... G11C 16/08
2017/0372789 A1 * 12/2017 Ray ..... G11C 16/16
2019/0057898 A1 2/2019 Shim et al.
2019/0102104 A1 * 4/2019 Righetti ..... G06F 3/0652
2019/0147582 A1 * 5/2019 Lee ..... G06T 11/00 382/156
2019/0156896 A1 5/2019 Park et al.
2020/0105347 A1 4/2020 Nam et al.

OTHER PUBLICATIONS

Notice of Allowance in Korean Appln. No. 10-2018-0116555, mailed on Jun. 20, 2024, 4 pages (with English translation).

* cited by examiner

MEMORY DEVICE CONFIGURED TO ALTERNATELY APPLY AN ERASE VOLTAGE AND AN INHIBIT VOLTAGE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application claims the benefit of Korean Patent Application No. 10-2018-0116555, filed on Sep. 28, 2018 in the Korean Intellectual Property Office, the disclosure of which is incorporated herein in its entirety by reference.

BACKGROUND

1. Field of the Inventive Concepts

The present inventive concepts relate to a memory device which detects a word line bridge defect, using an erasing operation of a memory block, and a storage system using the same.

2. Description of the Related Art

A memory device is a storage device that may store data and read the data when necessary. Memory devices may be broadly divided into a nonvolatile memory (NVM) in which stored data is not erased even if power is not supplied, and a volatile memory (VM) in which stored data is erased if no power is supplied.

In order to control a plurality of memory cells arranged in the memory device, various wirings may be arranged and used inside the memory device. Examples of these wirings may include a word line and a bit line connected to the memory cells.

As the size of the memory device is gradually miniaturized, intervals or distances between the wirings arranged therein are also narrowed. As a result, various defects such as bridge defects, in which wirings to be insulated from each other are undesirably electrically connected to each other, are likely to occur. Since such defects degrade the operation performance of the memory device, research for detecting and/or remedying such defects is necessary.

SUMMARY

Aspects of the present inventive concepts provide a memory device and a storage system for detecting a word line bridge defect through erase verification of the memory device.

According to some aspects of the present inventive concepts, a memory device comprises: a first memory cell, and a second memory cell different from the first memory cell, wherein the first memory cell and the second memory cell are included in same memory block as each other; a first word line connected to the first memory cell; a second word line, different from the first word line, connected to the second memory cell; an address decoder which is configured to apply one of an erase voltage and an inhibit voltage different from the erase voltage to each of the first and second word lines; and a control logic which is configured to control an erasing operation on the memory block, using the address decoder, wherein while the erasing operation on the memory block is executed, the inhibit voltage is applied to the first word line after the erase voltage is applied, and the erase voltage is applied to the second word line after the inhibit voltage is applied.

According to some aspects of the present inventive concepts, a memory device comprises: a first memory cell and a second memory cell different from the first memory cell, wherein the first memory cell and the second memory cell are included in a same memory block as each other; a first word line connected to the first memory cell, and a second word line, different from the first word line, connected to the second memory cell; an address decoder connected to the first and second word lines; and a control logic which is configured to control the address decoder to execute an erasing operation of the memory block and an erasing verification operation of the memory block, wherein the control logic is configured to execute a first erasing operation on the memory block to apply one of an erase voltage and an inhibit voltage different from the erase voltage to each of the first and second word lines, and to execute the first erasing verification operation on the memory block to verify whether the memory block is erased, wherein while the first erasing operation is executed, the inhibit voltage is applied to the second word line during at least a part of a time section during which the erase voltage is applied to the first word line, and the inhibit voltage is applied to the first word line during at least another part of the time section during which the erase voltage is applied to the second word line, and wherein the control logic is configured to determine that a word line bridge defect exists in the memory block in response to the erase of the memory block being determined to be failed as a result of the execution of the first erasing verification operation.

According to some aspects of the present inventive concepts, a memory device comprises: a plurality of memory cells, different from each other, included in a same memory block as each other; a plurality of word lines, different from each other, connected to each of the plurality of memory cells and, an address decoder which is configured to apply one of an erase voltage and an inhibit voltage different from erase voltage to each of the plurality of word lines; and a control logic which is configured to control when the address decoder applies the erase voltage to the plurality of word lines, and to control when the address decoder applies the inhibit voltage to the plurality of word lines, wherein the plurality of word lines includes a group of even word lines and a group of odd word lines, and a first time point at which the erase voltage is applied to at least a portion of the group of the even word lines is different from a second time at which the erase voltage is applied to at least a portion of the group of odd word lines.

According to some embodiments of the present inventive concepts, a storage system comprises: a memory device which includes a memory cell array including a plurality of memory blocks, a first word line connected to a first memory block among the plurality of memory blocks, and a second word line, different from the first word line, connected to the first memory block; and a controller connected to the memory device, wherein the controller is configured to provide an erasing command of the first memory block to the memory device in response to a request from a host which is connected to the storage system, and the memory device is configured to receive the erasing command of the first memory block and to apply one of an erase voltage and an inhibit voltage different from the erase voltage to the first and second word lines, and a first time point at which the erase voltage is applied to the first word line is different form a second time point at which the erase voltage is applied to the second word line.

According to some aspects of the present inventive concepts, a memory device comprises: a first memory cell, and a second memory cell different from and adjacent to a first memory cell, wherein the first memory cell and the second memory cell are included in a same memory block as each other; a first word line connected to the first memory cell; a second word line, different from the first word line, connected to the second memory cell; an address decoder which is configured to apply one of an erase voltage and an inhibit voltage different from the erase voltage to each of the first and second word lines during an erase operation for the memory block; and a control logic which is configured to control an erasing operation on the memory block, using the address decoder, wherein during the erase operation for the memory block, the inhibit voltage is applied to the first word line during substantially an entire time that the erase voltage is applied to the second word line, and the erase voltage is applied to the first word line during substantially an entire time that the inhibit voltage is applied to the second word line.

However, aspects of the present inventive concepts are not restricted to the one set forth herein. The above and other aspects of the present inventive concepts will become more apparent to one of ordinary skill in the art to which the present inventive concepts pertain by referencing the detailed description of the present inventive concepts given below.

BRIEF DESCRIPTION OF THE DRAWINGS

The above and other aspects and features of the present disclosure will become more apparent by describing in detail example embodiments thereof with reference to the attached drawings.

DETAILED DESCRIPTION OF THE EMBODIMENTS

Figure 1:
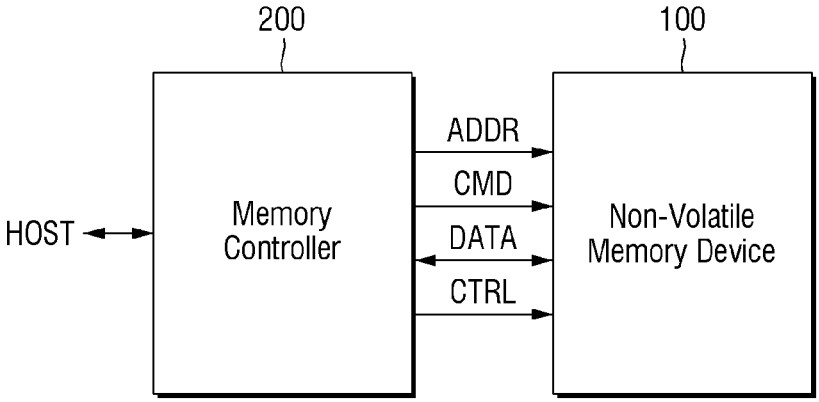
FIG. 1 is an example block diagram illustrating a storage system according to some embodiments.

FIG. 1 is an example block diagram illustrating a storage system according to some embodiments. Referring to FIG. 1, the storage system includes a memory controller 200 and a nonvolatile memory device 100. Examples of the storage system illustrated in FIG. 1 may include a flash memory device such as a memory card, a universal serial bus (USB) memory device, and a Solid State Drive (SSD), but the embodiments are not limited to these examples.

Memory controller 200 may be connected to a HOST and nonvolatile memory device 100. Memory controller 200 may be configured to access nonvolatile memory device 100 in response to a request from the HOST as illustrated in FIG. 1. Memory controller 200 may be configured to provide an interface between nonvolatile memory device 100 and the HOST. Further, memory controller 200 may be configured to drive firmware for controlling nonvolatile memory device 100. Memory controller 200 may control the operation of nonvolatile memory device 100. Specifically, memory controller 200 may provide a command CMD, an address ADDR and a control signal CTRL via one or more input/output lines connected to nonvolatile memory device 100. In addition, memory controller 200 may provide or receive data (DATA) along the input/output line(s) connected to nonvolatile memory device 100. The control signal CTRL provided by the memory controller 200 to the nonvolatile memory device 100 may include, for example, chip enable CE, write enable WE, read enable Re and like, but embodiments are not limited thereto. Memory controller 200 may also include an Error-correcting code (ECC) circuit for correcting error bits. The ECC circuit may correct the error bits included in the data. However, the embodiments are not limited thereto, and an ECC circuit may be provided as a constituent element of nonvolatile memory device 100. Each of memory controller 200 and nonvolatile memory device 100 may be provided as one chip, one package, one module, or the like. Memory controller 200 and nonvolatile memory device 100 may be implemented, using package technologies such as, for example, package on package (PoP), ball grid arrays (BGAs), chip scale packages (CSPs), plastic leaded chip carrier (PLCC), plastic dual in-line package PDIP, Die in Waffle Pack, Die in Wafer Form, chip on board (COB), ceramic dual in-line package (CERDIP), plastic metric quad flat pack MQFP, thin quad flat pack (TQFP), small outline integrated circuit (SOIC), shrink small outline package (SSOP), thin small outline package (TSOP), thin quad flat pack (TQFP), system in package SIP, multi-chip semiconductor package (MCP), wafer-level fabricated package (WFP) and wafer-level processed stack package (WSP).

Figure 2:
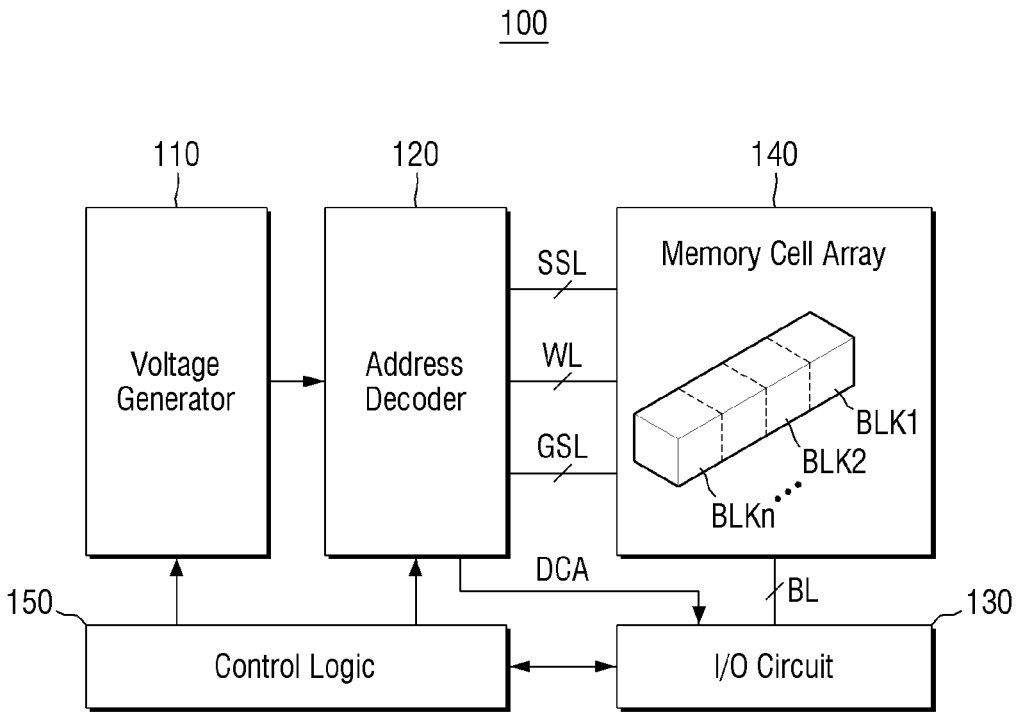
FIG. 2 is an example block diagram for explaining the nonvolatile memory device of FIG. 1.

FIG. 2 is an example block diagram for explaining the nonvolatile memory device of FIG. 1. Referring to FIGS. 1 and 2, nonvolatile memory device 100 may include a voltage generator 110, an address decoder 120, an input/output (I/O) circuit 130, a memory cell array 140 and a control logic 150.

Nonvolatile memory device 100 may include, for example, a NAND flash memory, a vertical NAND flash memory (VNAND), a NOR flash memory, a resistive RAM (RRAM), a phase change memory (PRAM), a magnetoresistance memory (MRAM), a ferroelectric memory (FRAM), a spin injection magnetization reversal memory (Spin STT-RAM), and the like, but the embodiments are limited to these examples. Hereinafter, examples will be described by taking an example in which nonvolatile memory device 100 is a vertical NAND flash memory (VNAND). However, the ideas and principles described below are not limited to these examples.

Voltage generator 110 may generate one or more operating voltages necessary for operation of nonvolatile memory device 100, using a power supply voltage supplied to nonvolatile memory device 100. The operating voltage(s) may include, for example, a program voltage, a program pass voltage, a read voltage, a read pass voltage, a verification voltage, an erase voltage, a common source line voltage, a well voltage, and the like, but the embodiments are not limited thereto.

Address decoder 120 may be connected to memory cell array 140 via a string selection line SSL, a word line WL and a ground selection line GSL. Address decoder 120 may operate in response to the control of control logic 150. Address decoder 120 may receive an address ADDR from memory controller 200. Address decoder 120 may decode a row address in the received address ADDR. Address decoder 120 may select the string selection line SSL, the word line WL and the ground selection line GSL, on the basis of the decoded row address. Address decoder 120 may supply an operating voltage provided from voltage generator 110 to each of selected or unselected string selection lines SSL, the word line WL and the ground selection line GSL. Address decoder 120 may decode a column address in the received address ADDR. The decoded column address DCA may be provided to input/output circuit 130. For example, address decoder 120 may include constituent elements such as a row decoder, a column decoder, an address buffer, and the like, but embodiments are not limited thereto.

Input/output circuit 130 may be connected to memory cell array 140 through a bit line BL. Further, input/output circuit 130 may exchange data (DATA) with control logic 150. Input/output circuit 130 may operate in response to the control of control logic 150. Input/output circuit 130 may receive a column address DCA decoded by address decoder 120, and may select the bit line BL, using the decoded column address DCA.

Memory cell array 140 may be connected to address decoder 120 via the string selection line SSL, the word line WL and the ground selection line GSL. Memory cell array 140 may be connected to input/output circuit 130 via the bit line BL. As described in more detail with respect to FIGS. 3 and 4 below, memory cell array 140 may be implemented, for example, in a three-dimensional array structure (3D array structure). The three dimensional memory array may have a vertical directionality, and may include a plurality of vertical NAND strings in which at least one memory cell is located over another memory cell. The at least one memory cell may, for example, include an electric charge trap layer. Each vertical NAND string may include at least one select transistor located above the memory cells. The at least one select transistor may have the same structure as the memory cell, and may be monolithically formed together with the memory cells. The term "monolithic" means that the layers of each level of the three dimensional array are directly deposited on the lower level layers of the three-dimensional array. The three-dimensional memory array includes a plurality of levels, and the shared word line WL or the bit line BL may be arranged between the levels. Nonvolatile memory device 100 may be a flash memory device in which the electric charge storage layer is made up of a conductive floating gate, or may be a charge trap type flash (CTF) memory device in which the electric charge storage layer is made up of an insulating film. Hereinafter, it is assumed that nonvolatile memory device 100 is a vertical NAND flash memory device as an example.

Memory cell array 140 may include a plurality of memory blocks BLK1 to BLKn. Each of the plurality of memory blocks BLK1 to BLKn is connected to address decoder 120 via the plurality of word lines WL, at least one string selection line SSL and at least one ground selection line GSL, and may be connected to input/output circuit 130 via a plurality of bit lines BL. In some embodiments, the plurality of word lines WL may have a stacked plate-like structure. Each of the plurality of memory blocks BLK1 to BLKn is arranged on the substrate in a first direction and a second direction different from the first direction, and may have a three-dimensional structure by including a plurality of strings arranged in a third direction perpendicular to a plane formed by the first and second directions. Here, each of the plurality of strings may include at least one string selection transistor, a plurality of memory cells, and at least one ground selection transistor serially connected between the bit line and the common source line CSL. Here, each of the plurality of memory cells may store at least one bit.

Figure 3:
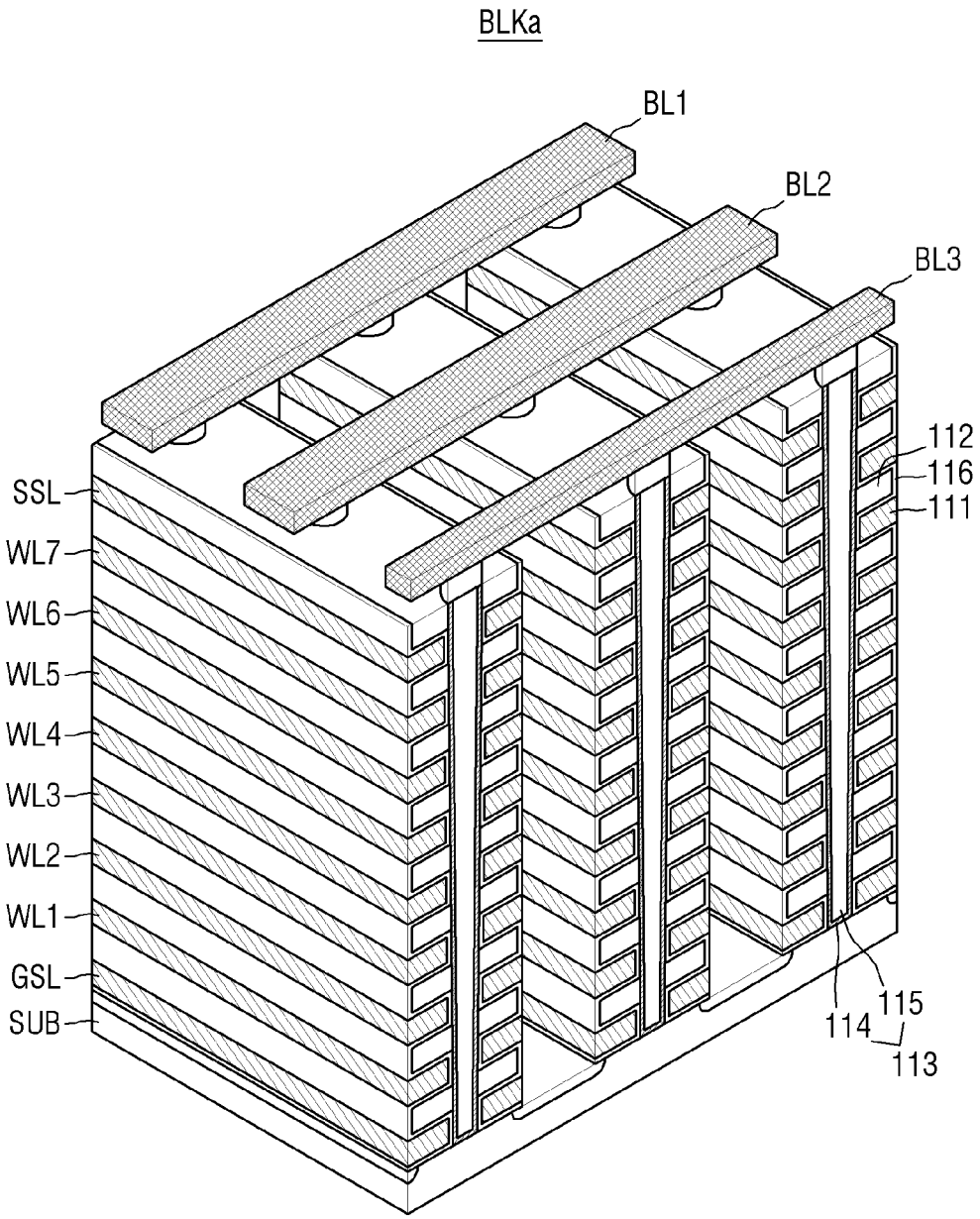
FIG. 3 is an example diagram for illustrating a memory block according to some embodiments.
Figure 4:
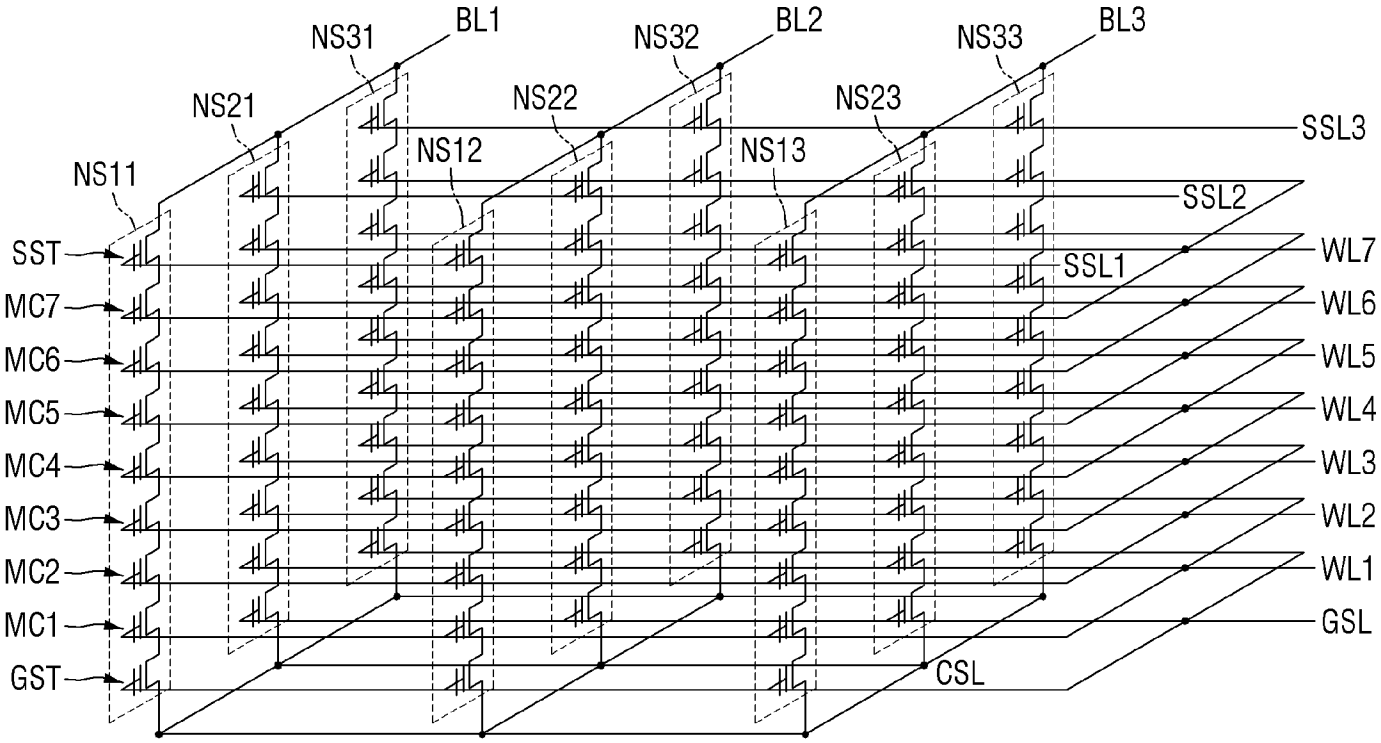
FIG. 4 is an example equivalent circuit diagram of the memory block according to some embodiments.

FIG. 3 is an example diagram for illustrating a memory block according to some embodiments. FIG. 4 is an example equivalent circuit diagram of the memory block according to some embodiments. Referring to FIG. 3, the first memory block BLKa may be formed in a direction perpendicular to a substrate SUB. The substrate SUB may include n-type or p-type impurities. The first memory block BLKa may be any one of a plurality of memory cell blocks BLK1 to BLKn included in the memory cell array (140 of FIG. 2).

Gate electrodes 111 and insulating films 112 may be alternately stacked on the substrate SUB to form a vertical stack of corresponding memory cells for each bit line BL1 through BL3. A data storage film 116 may be formed between gate electrode 111 and insulating film 112.

Pillar 113 may penetrate through gate electrode 111 and insulating film 112 in the vertical direction. Pillar 113 may be formed in a V shape as illustrated. Pillar 113 penetrates through gate electrode 111 and insulating film 112 and may be connected to the substrate SUB. The inside of pillar 113 is a charged dielectric pattern 115 and may be made of an insulating material such as silicon oxide. The outside of pillar 113 is a vertical active pattern 114 and may be made of a channel semiconductor.

Gate electrode 111 of the first memory block BLKa may be connected to the ground selection line GSL and the plurality of word lines WL1 to WL7, and the string selection line SSL. Vertical active pattern 114 formed outside pillar 113 of the first memory block BLKa may be connected to the plurality of bit lines BL1 to BL3. In FIG. 3, it is illustrated that the first memory block BLKa has two select lines GSL and SSL, the seven word lines WL1 to WL7, and three bit lines BL1 to BL3. However, the embodiments are not limited thereto. If necessary, the number of wirings may be modified and embodied by any other arrangement.

Referring to FIG. 4, cell strings NS11 to NS33 may be arranged between the bit lines BL1 to BL3 and the common source line CSL. Each of the cell strings (e.g., NS 11) may include a ground selection transistor GST, a plurality of memory cells MC1 to MC7, and a string selection transistor SST.

The string selection transistor SST may be connected to a string selection line SSL. The string selection line SSL may include first to third string selection lines SSL1 to SSL3. The ground selection transistor GST may be connected to the ground selection line GSL. The string selection transistor SST may be connected to the bit line BL, and the ground selection transistor GST may be connected to the common source line CSL.

The first memory cell MC1 to the seventh memory cell MC7 may be connected to the corresponding first word line WL1 to the seventh word line WL7, respectively. The first memory block BLKa may be a unit of data erasure. In other words, when the erasing operation of the first memory block BLKa is executed, the data stored in all the memory cells MC1 to MC7 included in the first memory block BLKa may be erased at once. On the other hand, each of the first memory cell MC1 to the seventh memory cell MC7 may store data of one bit or data of two or more bits. A memory cell that may store data of one bit is called a single level cell SLC. A memory cell that may store data of two or more bits is called a multi-level cell MLC.

Figure 5:
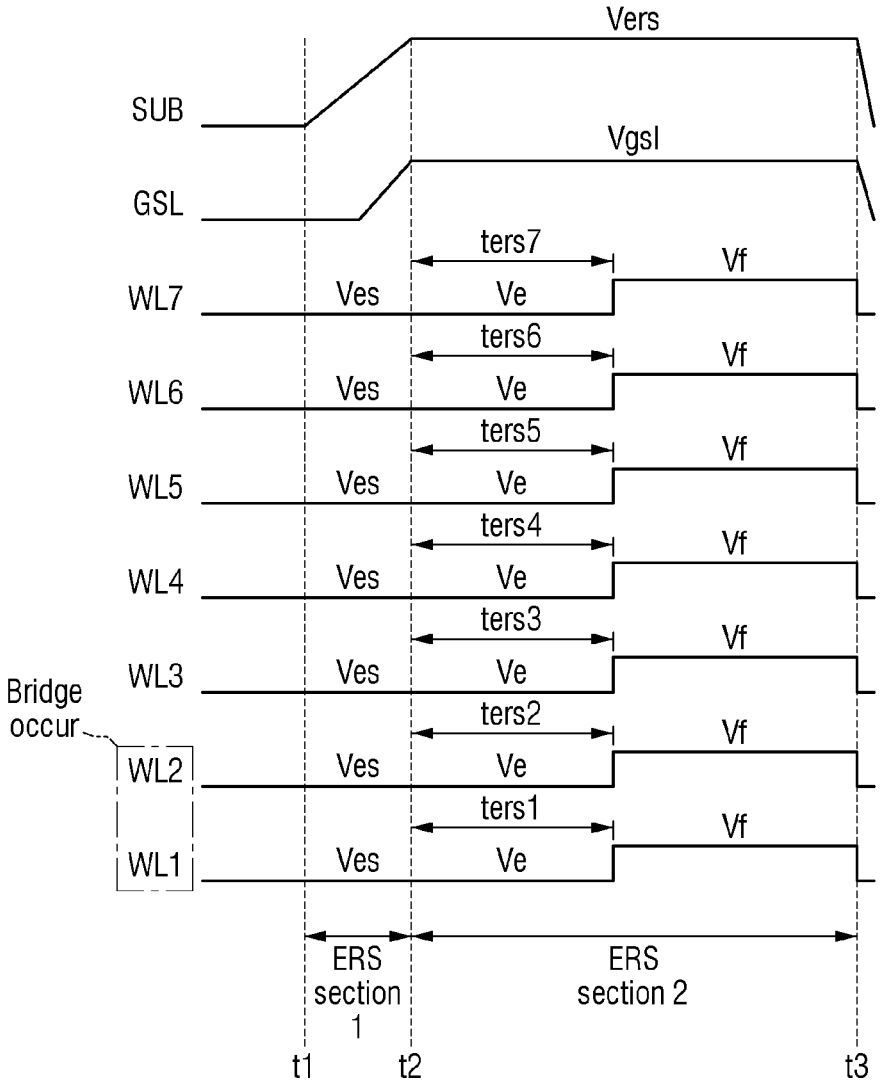
FIG. 5 is an example timing diagram for describing an erasing operation of a memory block according to some embodiments.

FIG. 5 is an example timing diagram for describing an erasing operation of a memory block according to some embodiments. Referring to FIGS. 1, 2, 4 and 5, in response to a request from a HOST, the memory controller 200 provides a command CMD to nonvolatile memory device 100, and may erase a specific memory block. According to some embodiments, control logic 150 may receive the command CMD. Control logic 150 may execute the erasing operation on the first memory block BLKa on the basis of the received command CMD.

The erasing operation of the first memory block BLKa may include a first erase section (ERS section 1) and a second erase section (ERS section 2). During the first erase section (ERS section 1), a voltage may be applied to the substrate SUB, the ground selection line GSL and the first word line WL1 to the seventh word line WL7. For example, a voltage may be applied to the substrate SUB at a first time t1 at which the first erase section (ERS section 1) is started. The voltage of the substrate SUB may be increased during the first erase section (ERS section 1). The voltage of the substrate SUB may reach the substrate voltage Vers at the second time t2. The substrate voltage Vers may be a relatively high voltage. During the first erase section (ERS section 1), the voltage of the ground selection line GSL may increase. For example, in the first erase section (ERS section 1), address decoder 120 may float the ground selection line GSL. When the ground selection line GSL is floating, as the voltage of the substrate SUB increases, the voltage of the ground selection line GSL may be increased by coupling. The voltage of the ground selection line GSL may reach the ground selection line voltage Vgsl at the second time t2. Although FIG. 5 illustrates that the first time t1 at which the voltage of the substrate SUB increases differs from the time at which the voltage of the ground selection line GSL increases, the embodiments are limited thereto. During the first erase section (ERS section 1), a first voltage Ves may be applied to the first word line WL1 to the seventh word line WL7. The first voltage Ves may be, for example, a ground voltage, but the embodiments are not limited thereto. In the first erase section (ERS section 1), the voltage of the substrate SUB may be applied to the vertical active pattern 114 of the pillar 113. In other words, the voltage applied to the vertical active pattern 114 may be increased more and more in the first erase section (ERS section 1). Therefore, at the second time t2, the voltage of the vertical active pattern 114 may be a relatively high voltage.

The second erase section (ERS section 2) may be between the second time t2 and the third time t3. In the second erase section (ERS section 2), the voltage of the substrate SUB may be maintained at the substrate voltage Vers. Further, in the second erase section (ERS section 2), the voltage of the ground selection line GSL may be maintained at the ground selection line voltage Vgsl. In the second erase section (ERS section 2), the erase voltage Ve or an inhibit voltage Vf may be applied to the first word line WL1 to the seventh word line WL7. For example, address decoder 120 may apply one of the erase voltage Ve and the inhibit voltage Vf to the first word line WL1 to the seventh word line WL7 in the second erase section (ERS section 2), in accordance with a signal provided from control logic 150.

According to some embodiments, the erase voltage Ve may be applied to the first word line WL1 to the seventh word line WL7 at the second time t2 substantially at the same time. For example, the erase voltage Ve is applied to the first word line WL1 at the second time t2 and may be maintained for a first time period ters1. The erase voltage Ve is applied to the second word line WL2 at the second time t2 and may be maintained for a second time period ters2. The erase voltage Ve is applied to the third word line WL3 at the second time t2 and may be maintained for a third time period ters3. The erase voltage Ve is applied to the fourth word line WL4 at the second time t2 and may be maintained for a fourth time period ters4. The erase voltage Ve is applied to the fifth word line WL5 at the second time t2 and may be maintained for a fifth time period ters5. The erase voltage Ve is applied to the sixth word line WL6 at the second time t2 and may be maintained for a sixth time period ters6. The erase voltage Ve is applied to the seventh word line WL7 at the second time t2 and may be maintained for a seventh time period ters7. According to some embodiments, the first time period ters1 to the seventh time period ters7 may be substantially the same as each other. In the present specification, the term "substantially" is meant to include fine motion errors, measurement errors, errors due to external environmental changes (e.g., PVT fluctuations), manufacturing tolerance differences, and the like.

According to some embodiments, the inhibit voltage Vf may be applied to the first word line WL1 to the seventh word line WL7 substantially at the same time. For example, address decoder 120 may float the first word line WL1 to the seventh word line WL7 to apply the inhibit voltage Vf to the first word line WL1 to the seventh word line WL7. Therefore, the erase voltage Ve may be applied to the first word line WL1 to the seventh word line WL7 substantially at the same time, and the inhibit voltage Vf may be applied to the first word line WL1 to the seventh word line WL7 substantially at the same time.

According to some embodiments, the erase voltage Ve may be a relatively low voltage. For example, the erase voltage Ve may be a ground voltage or a similar voltage (e.g., 0.5 V). The inhibit voltage Vf may be greater than the erase voltage Ve. As described above, during the second erase section (ERS section 2), each of the voltage of the substrate SUB and the voltage of the ground selection line GSL may maintain the substrate voltage Vers and the ground selection line voltage Vgsl which are relatively high voltages. Therefore, the voltage of vertical active pattern 114 may also maintain a relatively high voltage. In the second erase section (ERS section 2), when an erase voltage Ve which is a relatively low voltage is applied to the first word line WL1 to the seventh word line WL7, a potential difference between the voltages of the first word line WL1 to the seventh word line WL7 and the voltage of vertical active pattern 114 may be relatively large. Therefore, due to a relatively large potential difference, the electric charge trapped in data storage film 116 is de-trapped and may be discharged to the substrate SUB via vertical active pattern 114. On the other hand, in the second erase section (ERS section 2), when the inhibit voltage Vf which is a relatively high voltage is applied to the first word line WL1 to the seventh word line WL7, the potential difference between the voltages of the first word line WL1 to the seventh word line WL7 and the voltage of vertical active pattern 114 may be relatively small. Therefore, due to a relatively small potential difference, since a potential difference necessary for trapping the electric charge trapped in data storage film 116 is not formed, the electric charge may not be discharged.

It is assumed in the following discussion that a bridge defect occurs between the first word line WL1 and the second word line WL2. Referring to FIG. 5, the time at which the erase voltage Ve or the inhibit voltage Vf is applied to the first word line WL1 and the second word line WL2 may be substantially the same. Therefore, while the erasing operation is executed, the voltages of the first word line WL1 and the second word line WL2 may be substantially the same as each other. Since the voltages of the first word line WL1 and the second word line WL2 are the same, no leakage current may be generated between the first word line WL1 and the second word line WL2. Finally, since the erase voltage Ve is applied to the first word line WL1 and the second word line WL2 for an expected time, even though there is a bridge defect between the first word line WL1 and the second word line WL2, the first memory block BLKa may be successfully erased.

Figure 6:
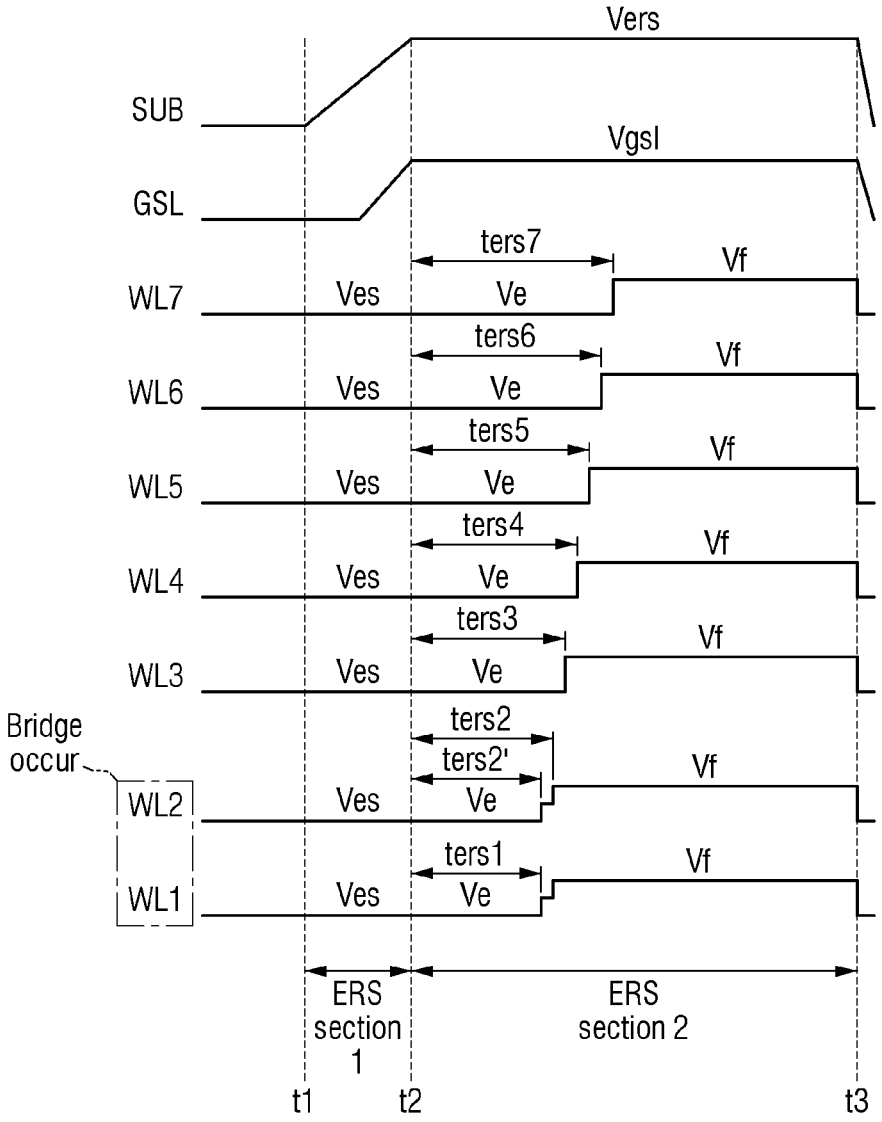
FIG. 6 is an example timing diagram for illustrating the erasing operation of the memory block according to some embodiments.

FIG. 6 is an example timing diagram for illustrating the erasing operation of the memory block according to some embodiments. Hereinafter, for convenience of explanation, repeated or similar contents of the aforementioned contents will be omitted or briefly explained.

According to some embodiments, depending on the height in the vertical direction, the size of the channel hole (e.g., vertical active pattern 114) of pillar 113 may vary. For example, the size of the channel hole in the lower part of the first memory block BLKa may be smaller than the size of the channel hole in the upper part of the first memory block BLKa. In other words, the size of the channel hole (e.g., vertical active pattern 114) adjacent to the first word line WL1 may be smaller than the size of the channel hole adjacent to the second word line WL2. As the size of the channel hole increases, in general, an effective area of the conductive layer forming a gate (e.g., gate electrode 111) decreases and the resistance increases. Further, a capacitance formed between the respective film layers also increases. Therefore, as the size of the channel hole increases, the coupling capacitance and the resistance of the cell transistor increase. Also, as the size of the channel hole becomes large, the intensity of the electric field applied to the electric charge storage layer of one cell when erasing decreases. Such a problem causes a difference in the FN tunneling effect depending on the position of the memory cell within the vertical stack. Therefore, the memory cells will have erase speeds different from each other depending on the different heights of the memory cells in the vertical direction of the channel hole. In other words, the erase speed of the memory cells disposed at the relatively lower part of the vertical stack may be faster than the erase speed of the memory cells disposed at the relatively upper part of the vertical stack. For example, the erase speed of the first memory cell (MC1 of FIG. 3) may be faster than the erase speed of the second memory cell (MC2 of FIG. 3). Therefore, the time period during which the erase voltage Ve is applied to the word line disposed at a relatively lower position in the vertical stack may be shorter than the time period during which the erase voltage Ve is applied to the word line located at a relatively upper position in the vertical stack.

According to some embodiments, the erase voltage Ve may be applied to the first word line WL1 to the seventh word line WL7 at the second time t2; that is at substantially the same time as each other. However, the time periods or durations during which the erase voltage Ve is applied to the first word line WL1 to the seventh word line WL7 may be different from each other. In other words, the first time period ters1 to the seventh time period ters7 may be different from each other. For example, the first time period ters1 to the seventh time period ters7 may be sequentially lengthened.

However, when a bridge defect exists in the first word line WL1 and the second word line WL2, due to the voltage difference between the first word line WL1 and the second word line WL2, a leakage current may be generated between the first word line WL1 and the second word line WL2. For example, from the time at which the inhibit voltage Vf is applied to the first word line WL1 to the time at which the inhibit voltage Vf is applied to the second word line WL2, the voltage of the first word line WL1 may be different from the voltage of the second word line WL2. At this time, a leakage current may be generated due to the voltage difference between the first word line WL1 and the second word line WL2. At this time, the voltage of the first word line WL1 may be reduced, and the voltage of the second word line WL2 may increase. In other words, due to the leakage current between the first word line WL1 and the second word line WL2, the actual time period during which the erase voltage Ve is applied to the second word line WL2, that is, a 2-1st time period ters2' may be less than a second time period ters2 which would exist if there was no bridge occurring between the first word line WL1 and the second word line WL2. The 2-1st time period ters2' is smaller than a targeted second time period ters2, but a difference between the 2-1st time period ters1' and the second time period ters2 may be relatively small. In other words, the difference between the 2-1st time period ters2' and the second time period ters2 may be very much smaller than the second time period ters2 or the 2-1st time period ters2'. That is, the 2-1st time period ters2' may be a time sufficient for the second memory cell (MC2 of FIG. 3) to be erased. Even if the erase voltage Ve is applied to the second word line WL2 for the 2-1st time period ters2', the erasing operation of the second memory cell (MC2 of FIG. 3) may succeed. In other words, even if a bridge defect exists between the first word line WL1 and the second word line WL2, the first memory block BLKa may be successfully erased. Now, a process of detecting a bridge defect using the erasing operation of the first memory block BLKa will be described with reference to FIGS. 7 to 9.

Figure 7:
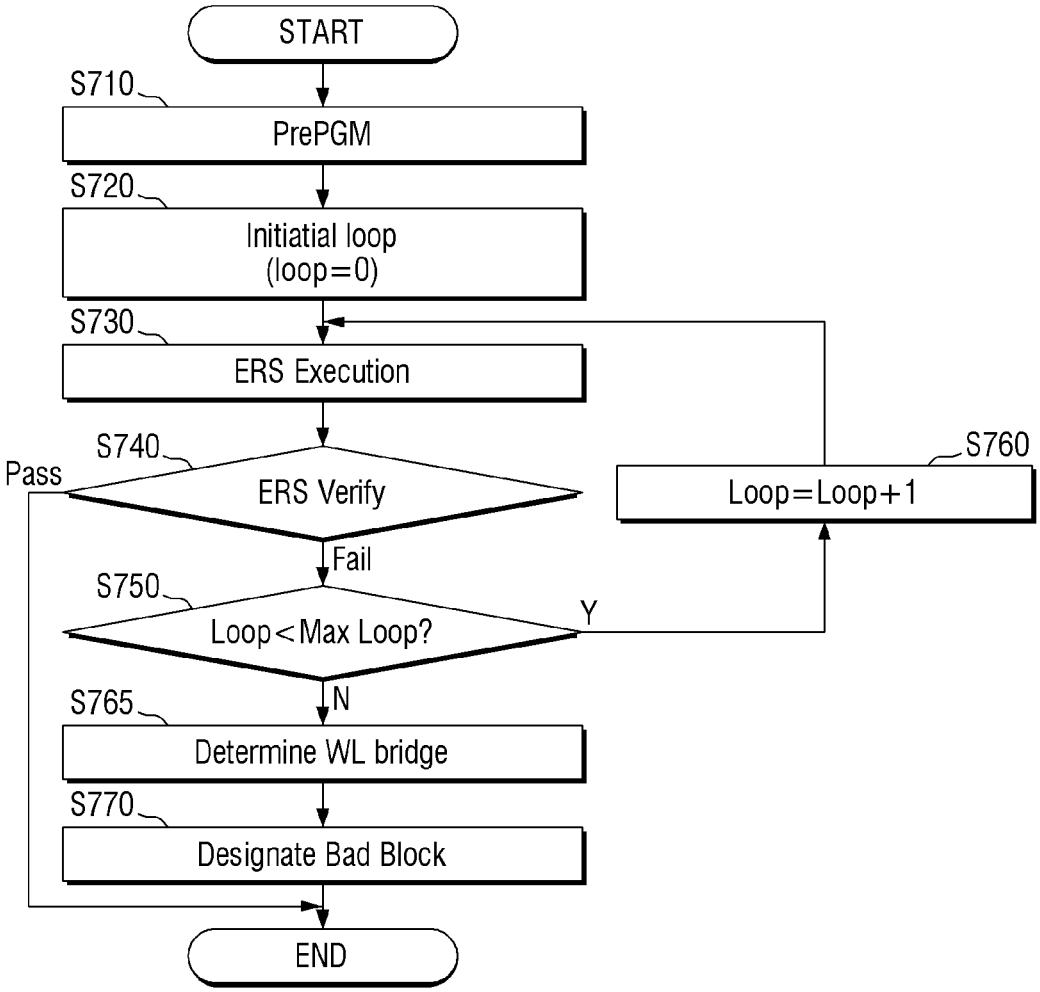
FIG. 7 is an example flowchart for explaining a method for detecting a bridge defect, using the erasing operation of the memory block according to some embodiments.
Figure 8:
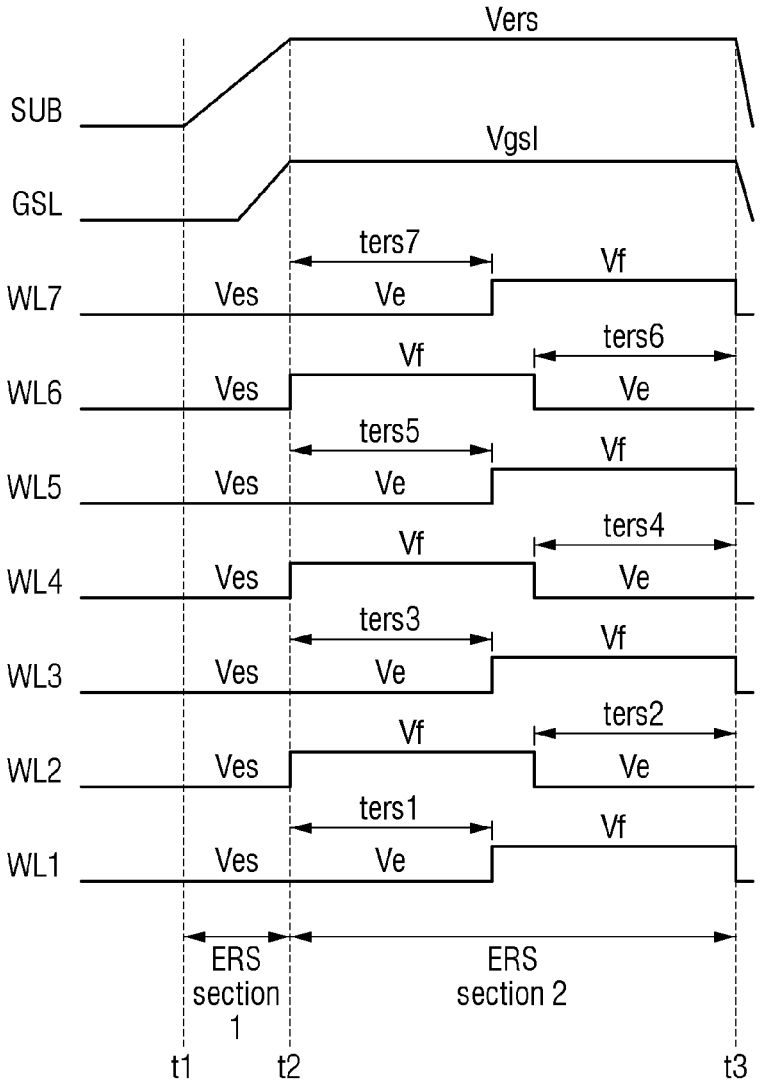
FIG. 8 is an example timing diagram for describing the erasing operation of the memory block according to some embodiments.
Figure 9:
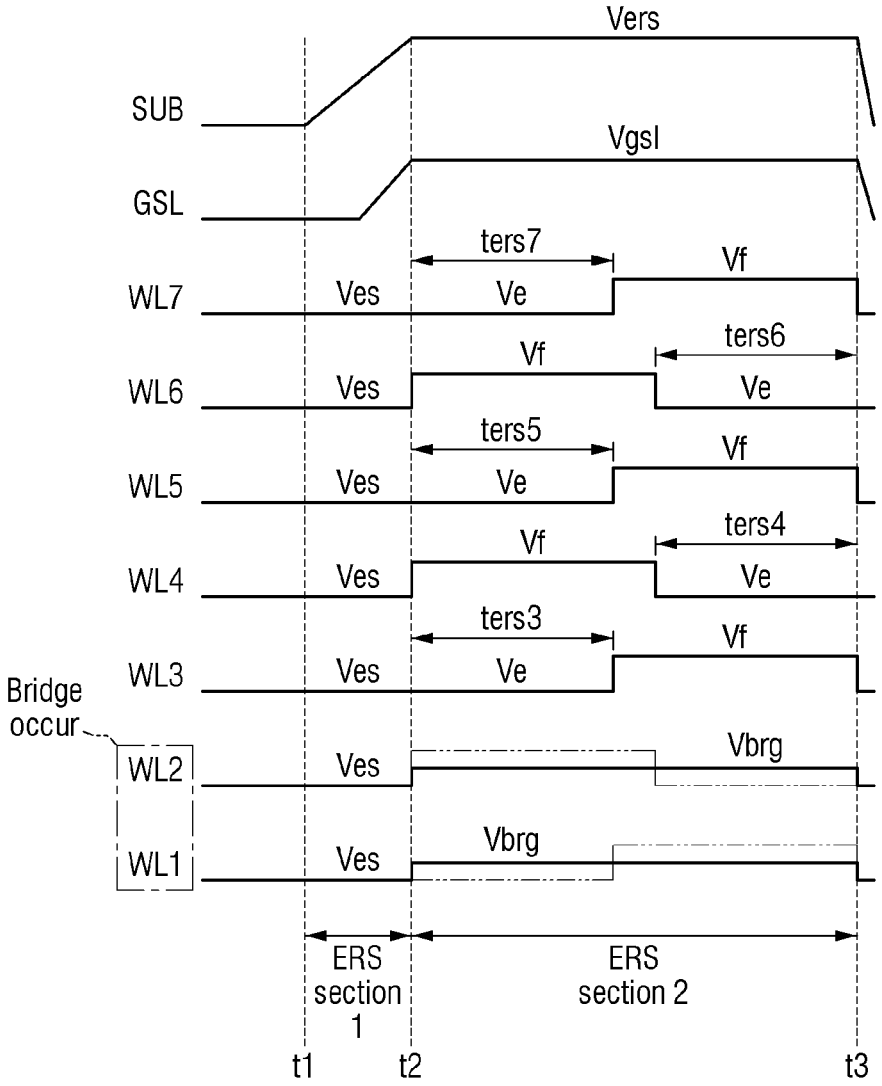
FIG. 9 is an example timing diagram illustrating the erasing operation of the memory block in the case where a bridge defect exists between the first word line WL1 and the second word line WL2 according to some embodiments.

FIG. 7 is an example flowchart for explaining a method for detecting a bridge defect, using the erasing operation of the memory block according to some embodiments. FIG. 8 is an example timing diagram for describing the erasing operation of the memory block according to some embodiments. FIG. 9 is an example timing diagram illustrating the erasing operation of the memory block in the case where a bridge defect exists between the first word line WL1 and the second word line WL2 according to some embodiments. In some embodiments, the process of FIG. 7 may be controlled by a control logic (150 of FIG. 2). The erasing operation of the first memory block BLKa will be described with reference to FIG. 7, but the embodiments are not limited thereto. For example, the erasing operation of FIG. 7 may also be executed on a second memory block (BLKb of FIG. 14) which will be described later.

Referring to FIG. 7, a pre-program (prepgm) operation may be executed on the first memory cell MC1 to the seventh memory cell MC7 included in the first memory block BLKa (S710). The pre-program operation may set the first memory cell MC1 to the seventh memory cell MC7 included in the first memory block BLKa to the same or similar state, before executing the erasing operation on the first memory block BLKa. However, the embodiments are not limited thereto, and the pre-program operation may be omitted according to some embodiments.

An initial loop number of the erasing operation on the first memory block BLKa is set (S720). For example, the initial loop number may be 0. The erasing operation of the first memory block BLKa is executed (S730). For specific explanation, reference is made to FIG. 8. Referring to FIG. 8, the times at which the erase voltage Ve is applied to the first word line WL1, the third word line WL3, the fifth word line WL5 and the seventh word line WL7 may be substantially the same as each other. For example, the erase voltage Ve may be applied to the first word line WL1, the third word line WL3, the fifth word line WL5 and the seventh word line WL7 at the second time t2. Likewise, the times at which the erase voltage Ve is applied to the second word line WL2, the fourth word line WL4 and the sixth word line WL6 may be substantially the same as each other. Hereinafter, for convenience of explanation, the first word line WL1, the third word line WL3, the fifth word line WL5 and the seventh word line WL7 are defined as a group of odd word lines. Further, the second word line WL2, the fourth word line WL4, and the sixth word line WL6 are defined as a group of even word lines.

According to some embodiments, the time at which the erase voltage Ve is applied to the group of odd word lines and the time at which the erase voltage Ve is applied to the group of even word lines may be different from each other. For example, the time at which the erase voltage Ve is applied to the group of odd word lines may precede the time at which the erase voltage Ve is applied to the group of even word lines. The inhibit voltage Vf may be applied to the group of odd word lines after the erase voltage Ve is applied. Also, the erase voltage Ve may be applied to the group of even word lines after the inhibit voltage Vf is applied. In other words, the erase voltages Ve may be alternately applied to the group of odd word lines and the group of even word lines. In other words, the inhibit voltage Vf may be applied to the group of even word lines in at least a part of an erase section (e.g., ERS section 2) in which the erase voltage Ve is applied to the group of odd word lines. Likewise, in at least a part of an erase section in which the erase voltage Ve is applied to the group of even word lines, the inhibit voltage Vf may be applied to the group of odd word lines. In the present specification, for the sake of convenience of explanation, the configuration, in which the times at which the erase voltage Ve is applied to some word lines are set to be different from each other, may be expressed as a configuration in which the erase voltage Ve is alternately applied to some word lines.

According to some embodiments, the total time period during which the erase voltage Ve is applied to the group of odd word lines may be the same as the total time period during which the erase voltage Ve is applied to the group of even word lines. For example, the erase voltage Ve is applied to the first word line WL1 during the first time period ters1, and the erase voltage Ve may be applied to the second word line WL2 during the second time period ters2 which is substantially the same as the first time period ter1. Even if the times at which the erase voltage Ve is applied to the group of odd word lines and the group of even word lines are different from each other, since the time periods during which the erase voltage Ve is applied to the group of the odd word lines and the group of even word lines are substantially the same as each other, all of the first memory cell MC1 to the seventh memory cells MC7 may be erased. In other words, even if the times at which the erase voltage Ve is applied to the group odd word lines and the group of even word lines are different from each other, the first memory block BLKa may be successfully erased.

Referring to FIG. 9, it is assumed that a bridge defect exists between the first word line WL1 and the second word line WL2. According to some embodiments, the inhibit voltage Vf may be applied to the group of even word lines in at least a part of the erase section (e.g., ERS erase section 2) in which the erase voltage Ve is applied to the group of odd word lines. Likewise, in at least a part of the section in which the erase voltage Ve is applied to the group of even word lines, the inhibit voltage Vf may be applied to the group of odd word lines. In other words, in the second erase section (ERS erase section 2), there may be a difference between the voltage of the group of even word lines and the voltage of the group of odd word lines. Therefore, when a bridge defect exists in the first word line WL1 and the second word line WL2, the bridge voltage Vbrg may be applied to the first word line WL1 and the second word line WL2 during the second erase section (ERS section 2). The bridge voltage Vbrg may be greater than the erase voltage Ve and less than the inhibit voltage Vf. FIG. 9 illustrates that the bridge voltage Vbrg is maintained at the same level in the second erase section, but the embodiments are not limited thereto. Since the bridge voltage Vbrg is applied to the first word line WL1 and the second word line WL2 for a relatively long time period, the erase voltage Ve may not be applied to each of the first word line WL1 and the second word line WL2 for a sufficient time period. Therefore, the electric charge trapped in the first memory cell MC1 and the second memory cell MC2 may not be discharged to the substrate SUB. In other words, if there is a bridge defect on the first word line WL1 and the second word line WL2, the erasing operation of the first memory block BLKa may fail. That is, the erasing operation of the first memory block BLKa according to some embodiments may induce the erasing operation of the first memory block BLKa to fail if a bridge defect exists in the word line. Therefore, when the erasing operation of the first memory block BLKa fails, it may be indirectly determined that there is a bridge defect of the word line.

Referring again to FIG. 7, it is verified whether the first memory block is erased BLKa (S740). For example, the control logic (150 of FIG. 2) applies the verification voltage to the first word line WL1 to the seventh word line WL7, using the address decoder (120 of FIG. 2), and may monitor the voltage change of the bit line BL to verify whether to erase the first memory block BLKa. If the erase operation of the first memory block BLKa is verified to have failed, it is determined whether the loop number is less than a predetermined maximum loop number (S750). If the loop number is less than the predetermined maximum loop number, 1 is added to the current loop number (S760), and the erasing operation of the first memory block BLKa is executed again (S730). When the loop number reaches the predetermined maximum loop number, control logic 150 determines that a word line bridge defect exists in the first memory block BLKa (S765), and sets the first memory block BLKa as a bad block (S770). Thereafter, the erasing operation of the first memory block BLKa is terminated. On the other hand, if the erase of the first memory block BLKa is verified to be successful (pass) (S740), the erasing operation of the first memory block BLKa is terminated.

Figure 10:
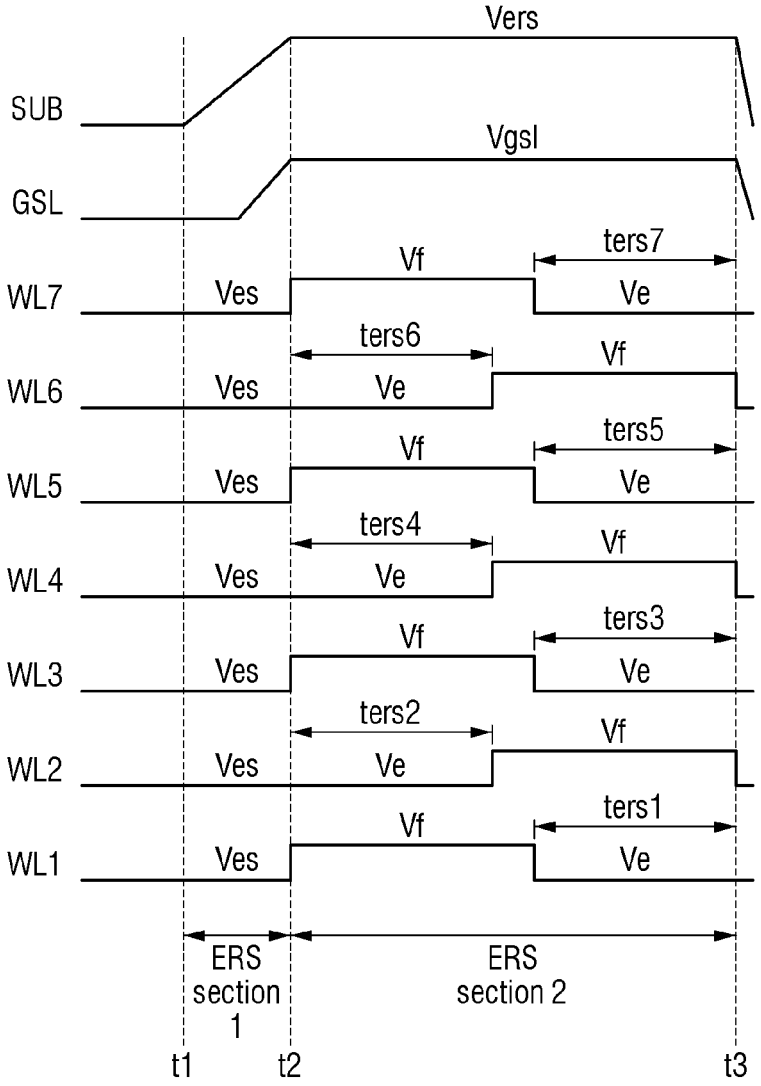
FIG. 10 is an example timing diagram for describing the erasing operation of the memory block according to some embodiments.

FIG. 10 is an example timing diagram for describing the erasing operation of the memory block according to some embodiments. Referring to FIG. 10, the time at which the erase voltage Ve is applied to the group of odd word lines may be different from the time at which the erase voltage Ve is applied to the group of even word lines. For example, the time at which the erase voltage Ve is applied to the group of even word lines may precede the time at which the erase voltage Ve is applied to the group of odd word lines. In other words, the inhibit voltage Vf may be applied to the group of even word lines after the erase voltage Ve is applied. Also, the erase voltage Ve may be applied to the group of odd word lines, after the inhibit voltage Vf is applied. According to some embodiments, the first time period ters1 to the seventh time period ters7 may be substantially the same as each other, but the embodiments are not limited thereto. For example, the first time period ters1 to the seventh time period ters7 may be different from each other.

Figure 11:
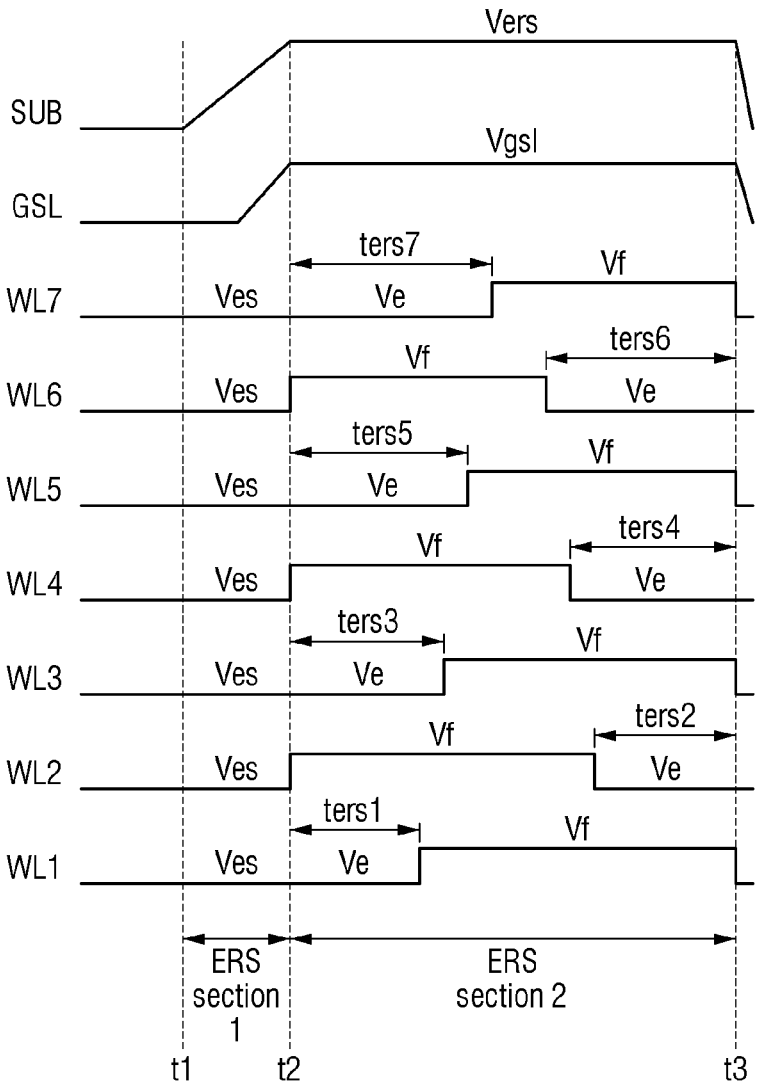
FIG. 11 is an example timing diagram for describing the erasing operation of the memory block according to some embodiments.

FIG. 11 is an example timing diagram for describing the erasing operation of the memory block according to some embodiments. Referring to FIG. 10, in the erasing operation of the memory block of FIG. 8, the total time period for which the erase voltage Ve is applied to the group of odd word lines may be different from the total time period for which the erase voltage Ve is applied to the group of even word lines. According to some embodiments, the erase voltage Ve may be applied to a word line disposed at a relatively lower position in the vertical stack for a shorter time period than to a word line disposed at a relatively upper position in the vertical stack. According to some embodiments, the first time period ters1 to the seventh time period ters7 may be different from each other. For example, the first time period ters1 to the seventh time period ters7 may be sequentially lengthened.

Figure 12:
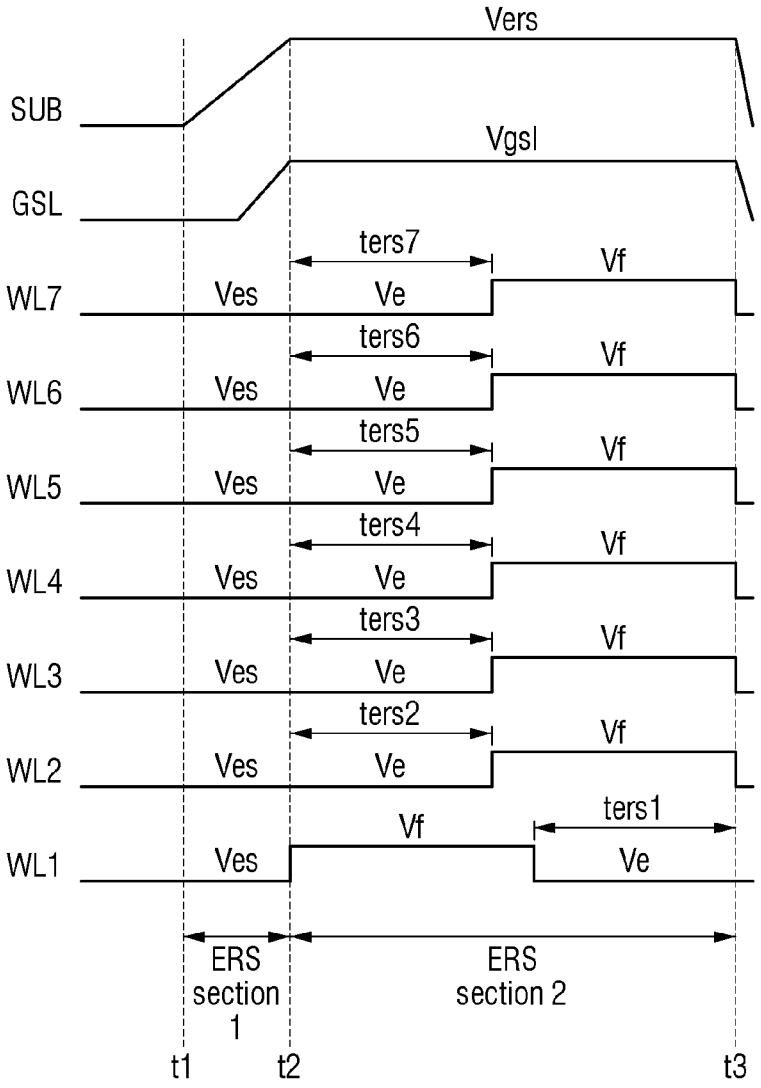
FIG. 12 is an example timing diagram for describing the erasing operation of the memory block according to some embodiments.

FIG. 12 is an example timing diagram for describing the erasing operation of the memory block according to some embodiments. Referring to FIG. 12, the time at which the erase voltage Ve is applied may be different between at least a part of the group of odd word lines and at least a part of the group of the even word lines. For example, it is possible to alternately apply the erase voltage Ve only to the word lines disposed at the relatively lower positions in the vertical stack in the first memory block BLKa. For example, the time at which the erase voltage Ve is applied to the first word line WL1 may be different from the time at which the erase voltage Ve is applied to the second word line WL2. For example, the time at which the erase voltage Ve is applied to the second word line WL2 may precede the time at which the erase voltage Ve is applied to the first word line WL1. The times at which the erase voltage Ve is applied to the second word line WL2 to the seventh word line WL7 may be, for example, substantially the same as each other. According to some embodiments, bridge defects may occur frequently in word lines disposed at the relatively lower positions in the vertical stack, due to structural problems in the manufacturing process. Therefore, the erase voltage Ve may be alternately applied to only to the word lines disposed at the relatively lower positions in the vertical stack.

According to some embodiments, the total time period during which the erase voltage Ve is applied to the second word line WL2 may be the same as the total time period during which the erase voltage Ve is applied to the first word line WL1. For example, the first time period ters1 to the seventh time period ters7 may be substantially the same as each other.

Although FIG. 12 illustrates that only the time at which the erase voltage Ve is applied to the first word line WL1 among the first word line WL1 to the seventh word line WL7 is set to be different than the others, the embodiments are not limited thereto. For example, the times at which the erase voltage Ve is applied to the first word line WL1 and the third word line WL3 may be set to be different than the others and/or each other. A person having ordinary knowledge in the technical field of the present inventive concepts may select a part of the vertical stack where the word lines are vulnerable to a bridge defect, and may appropriately adjust the application time of the erase voltage Ve to the corresponding word lines.

Figure 13:
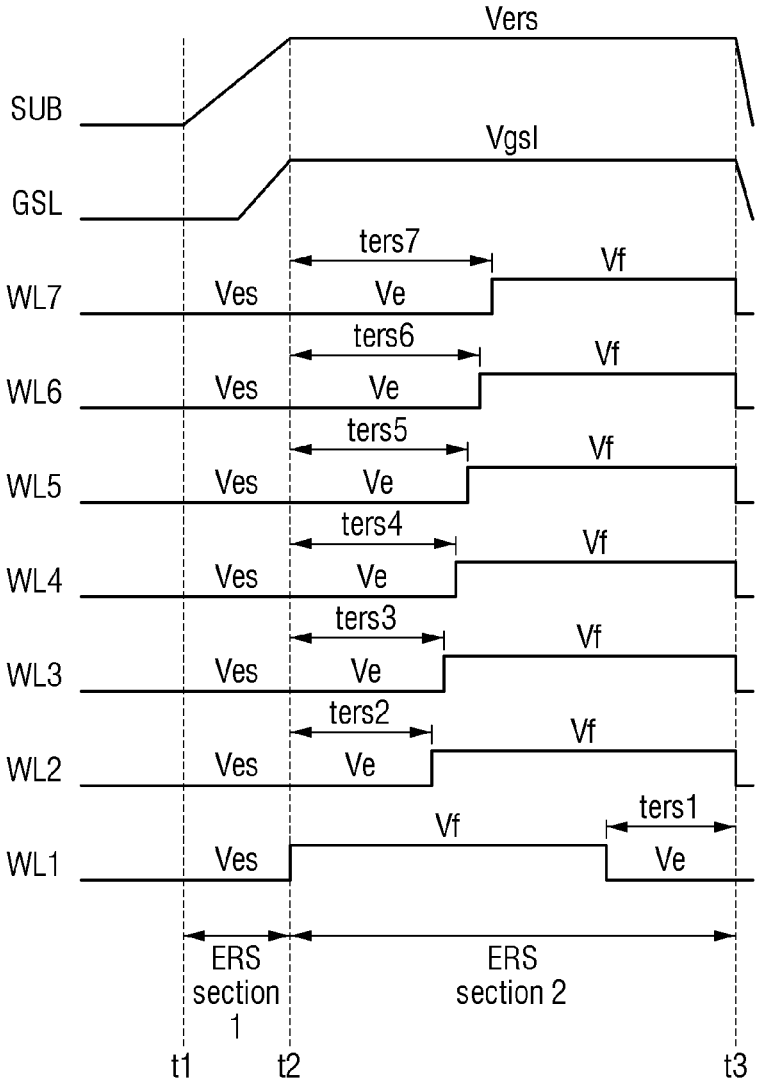
FIG. 13 is an example timing diagram for describing the erasing operation of the memory block according to some embodiments.

FIG. 13 is an example timing diagram for describing the erasing operation of the memory block according to some embodiments. Referring to FIG. 13, in the erasing operation of the first memory block BLKa described with reference to FIG. 12, the erase voltage Ve may be applied to the word lines disposed at the relatively lower position in the vertical stack for a shorter time period than the word lines disposed at a relatively upper position in the vertical stack. In other words, the first time period ters1 to the seventh time period ters7 may be different from each other. For example, the first time period ters1 to the seventh time period ters7 may be sequentially lengthened. This may be attributed to the difference in the erase speeds between the memory cells disposed at the relatively lower positions in the vertical stack and the memory cells disposed at the relatively upper positions in the vertical. Hereinafter, referring to FIGS. 14 and 15, a second memory block BLKb among the memory blocks BLK1 to BLKn of the memory cell array 140 will be described more specifically.

Figure 14:
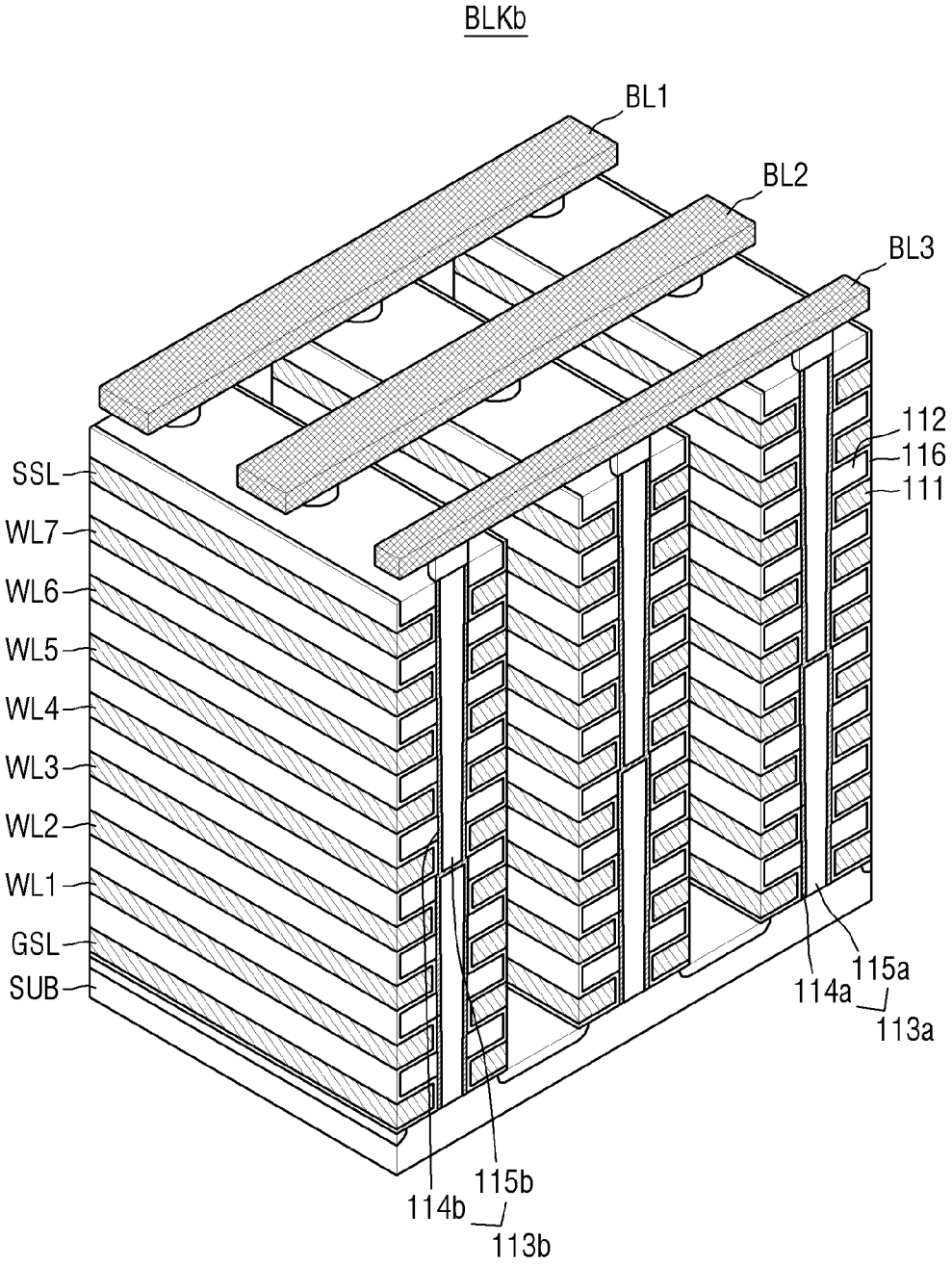
FIG. 14 is an example diagram for illustrating the memory block according to some embodiments.
Figure 15:
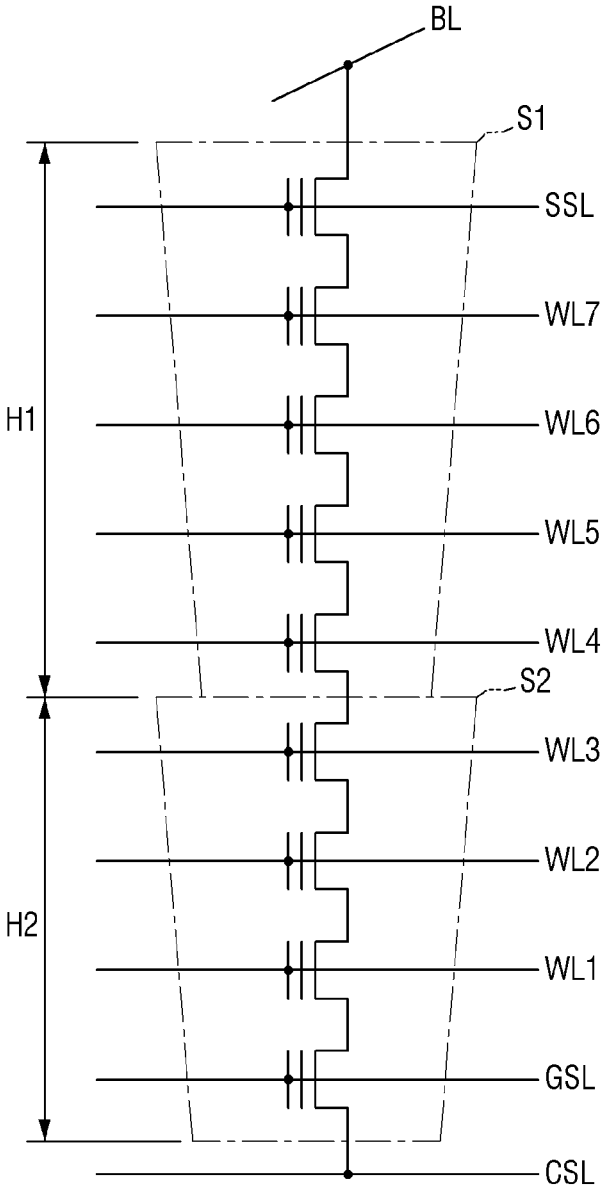
FIG. 15 is an equivalent circuit diagram briefly illustrating a part of a memory block according to some embodiments.

FIG. 14 is an example diagram for illustrating the memory block according to some embodiments. FIG. 15 is an equivalent circuit diagram briefly illustrating a part of a memory block according to some embodiments. The equivalent circuit of the second memory block BLKb according to some embodiments may be the same as the equivalent circuit diagram of FIG. 4. Further, the erasing operation of the second memory block BLKb according to some embodiments may be the same as or similar to the embodiments described above with reference to FIGS. 7 to 13.

Referring to FIGS. 14 and 15, the second memory block BLKb may be formed in a direction perpendicular to the substrate SUB. The substrate SUB may contain n-type or p-type impurities. The second memory block BLKb may be any one of a plurality of memory cell blocks BLK1 to BLKn included in the memory cell array (140 of FIG. 2).

A first sub-pillar 113a and a second sub-pillar 113b may penetrate gate electrode 111 and insulating film 112 in the vertical direction. First sub-pillar 113a and second sub-pillar 113b may be formed in a V shape as illustrated in the drawings. First sub-pillar 113a may be connected to second sub-pillar 113b and may be disposed on second sub-pillar 113b. Each of the inside of first sub-pillar 113a and the inside of second sub-pillar 113b is a first charge dielectric pattern 115a and a second charge dielectric pattern 115b, and may be made up of an insulating material such as silicon oxide. Each of the outside of first sub-pillar 113a and second sub-pillar 113b is a first vertical active pattern 114a and a second vertical active pattern 114b, and may be made up of channel semiconductors.

For convenience of explanation, the structure including first sub-pillar 113a is defined by a first structure S1, and the structure including second sub-pillar 113b is defined as a second structure S2. According to FIGS. 14 and 15, although a first height H1 of the first structure S1 is illustrated as being larger than a second height H2 of the second structure S2, the embodiments are not limited thereto. For example, the first height H1 may be less than or equal to the second height H2.

Figure 16:
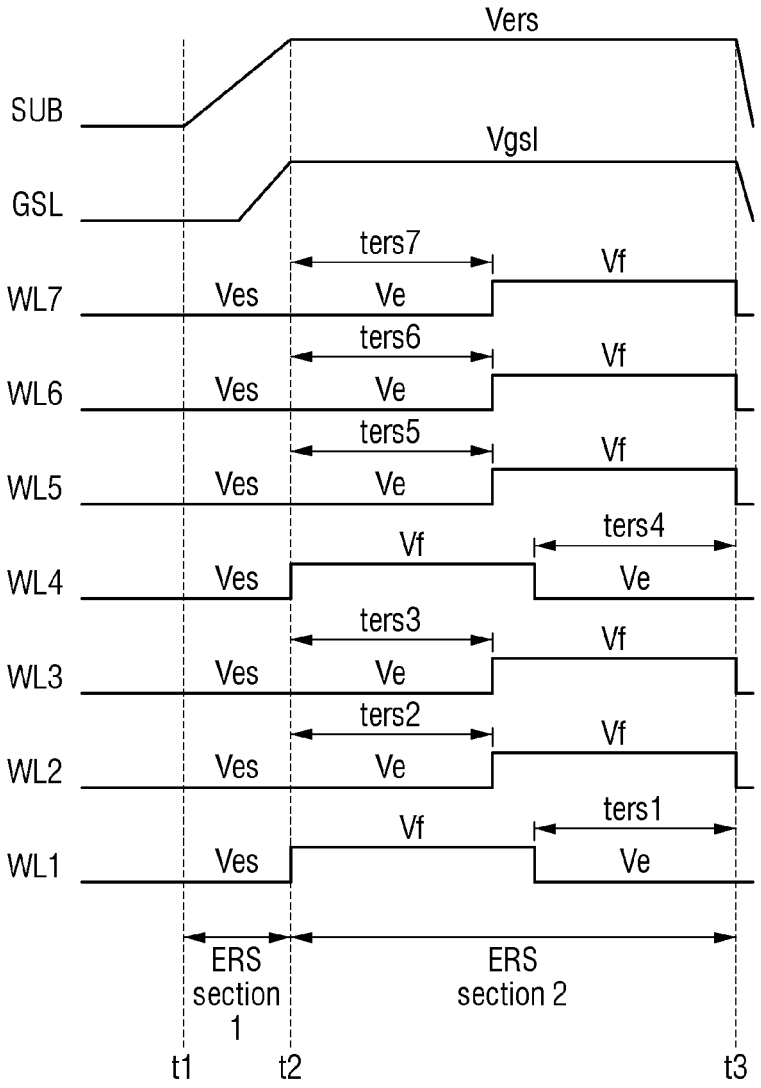
FIG. 16 is an example timing diagram for describing the erasing operation of the memory block according to some embodiments.

FIG. 16 is an example timing diagram for describing the erasing operation of the memory block according to some embodiments. Referring to FIG. 16, the erase voltage Ve may be alternately applied only to a portion of the word lines of the first structure S1 and a portion of the word lines of the second structure S2. For example, the time at which the erase voltage Ve is applied to the fourth word line WL4 disposed at the relatively lower part of the first structure S1 may differ from the time at which the erase voltage is applied to the fifth word line WL5 to the seventh word line WL7 disposed at the relatively upper part of the first structure S1. Similarly, the time at which the erase voltage Ve is applied to the first word line WL1 disposed at the relatively lower part of the second structure S2 may differ from the time at which the erase voltage Ve is applied to the second word line WL2 and the third word line WL3 disposed at the relatively upper part of the second structure S2. According to some embodiments, the total time periods (that is, the first to seventh time periods (ters1 to ters7) during which the erase voltage Ve is applied to the first word line WL1 to the seventh word line WL7 may be substantially the same as each other.

Figure 17:
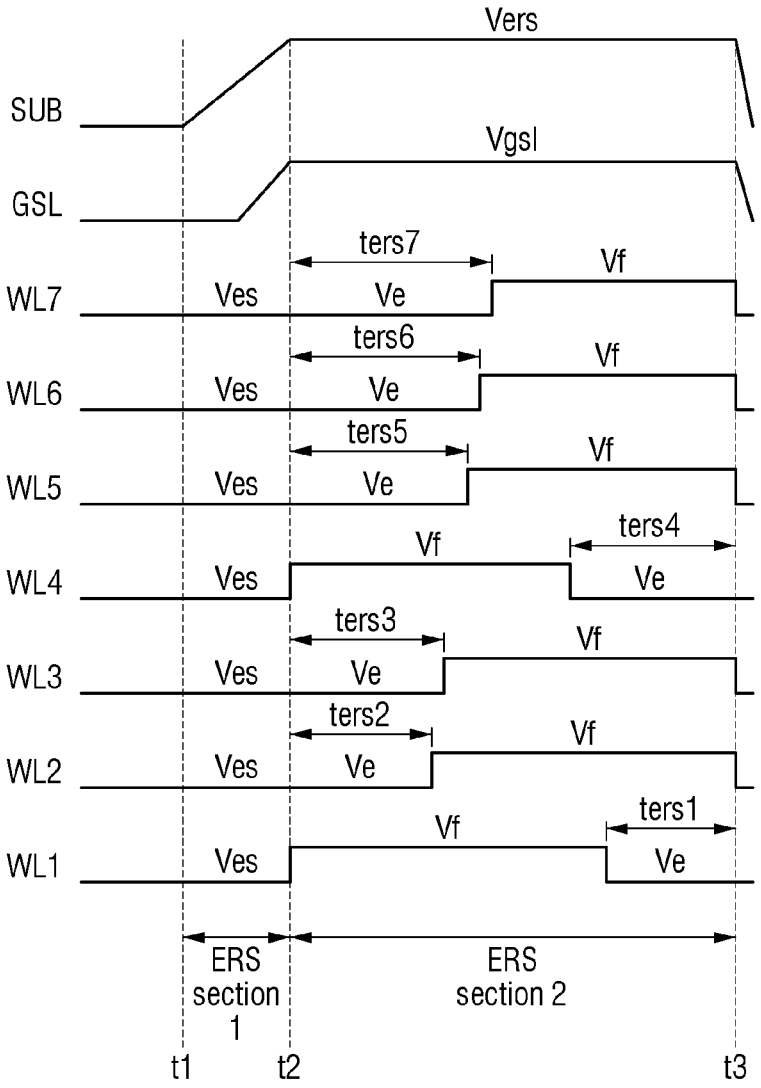
FIG. 17 is an example timing diagram for describing the erasing operation of the memory block according to some embodiments.

FIG. 17 is an example timing diagram for describing the erasing operation of the memory block according to some embodiments. According to some embodiments, in the erasing operation of the second memory block BLKb described in FIG. 16, the time periods for which the erase voltage Ve is applied to the first word line WL1 to the seventh word line WL7, that is, the first time period ters1 to the seventh time period ters7, may be different from each other. For example, the first time period ters1 to the seventh time period ters7 may be sequentially lengthened. This may be attributed to the difference in the erase speeds between the memory cells disposed at the relatively lower positions in the vertical and the memory cells disposed at the relatively upper positions in the vertical stack.

Figure 18:
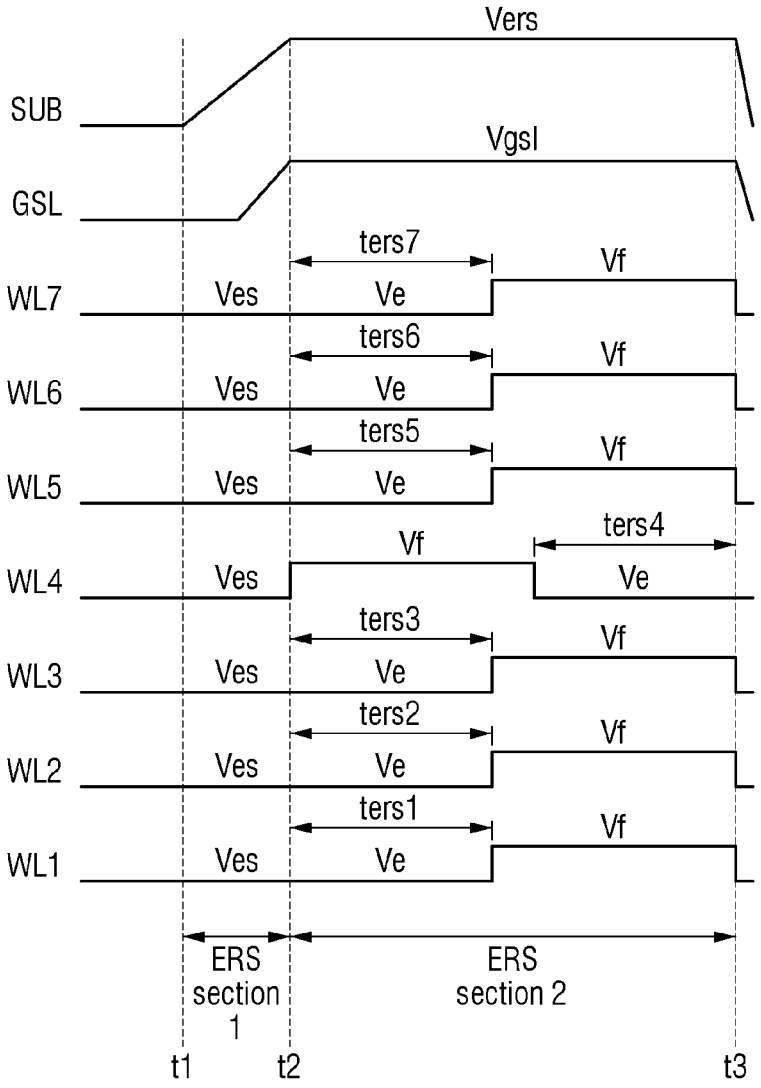
FIG. 18 is an example timing diagram for describing the erasing operation of the memory block according to some embodiments.

FIG. 18 is an example timing diagram for describing the erasing operation of the memory block according to some embodiments. According to some embodiments, bridge defects may occur more frequently in the first structure S1 which has a greater height among the first structure S1 and the second structure S2. Further, bridge defects may occur more frequently in the word line disposed in the lower part of the first structure S1 among the word lines included in the first structure S1.

Therefore, as illustrated in FIG. 18, the application time of the ease voltage Ve may be made different in only the portion of the word lines of the first structure S1, among the first structure S1 and the second structure S2. For example, the time at which the erase voltage Ve is applied to the fourth word line WL4 disposed at the relatively lower part of the first structure S1 may be different from the time at which the erase voltage is applied to the fifth word line WL5 to the seventh word line WL7 disposed at the relatively upper part of the first structure S1. The erase voltage Ve may be applied to the fifth word line WL5 to the seventh word line WL7 disposed in the first structure S1, and the first word line WL1 to the third word line WL3 disposed in the second structure S2 substantially at the same time as each other. According to some embodiments, the first time period ters1 to the seventh time period ters7 may be substantially the same as each other.

Figure 19:
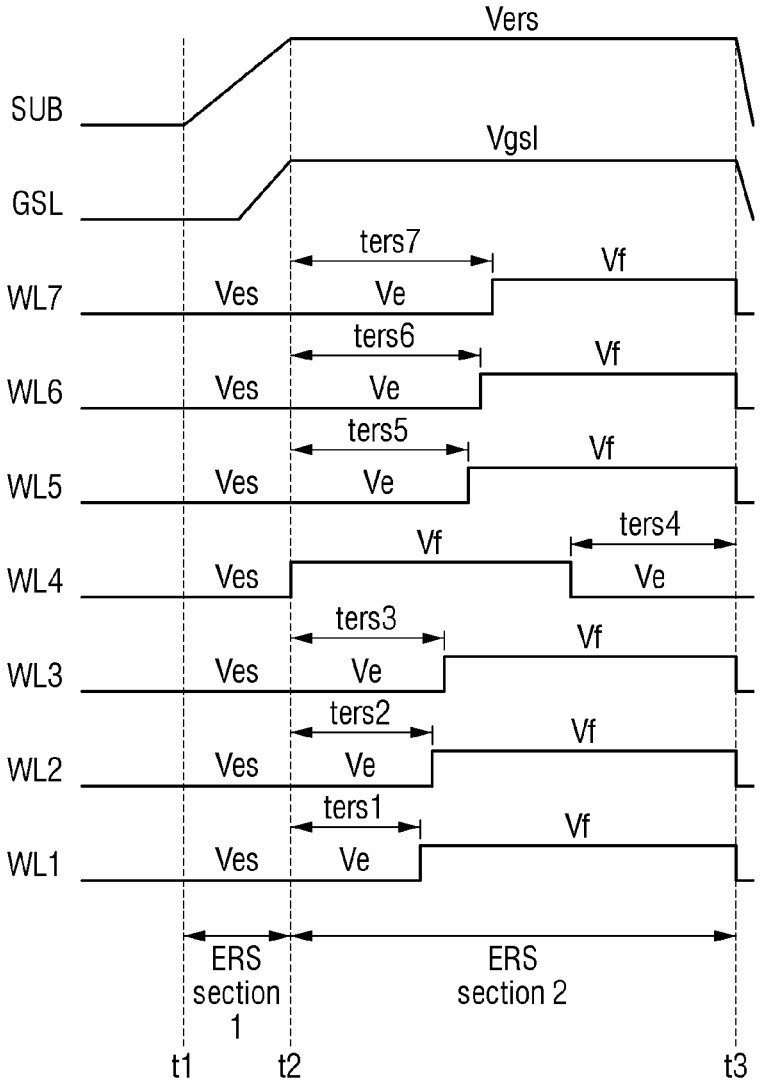
FIG. 19 is an example timing diagram for describing the erasing operation of the memory block according to some embodiments.

FIG. 19 is an example timing diagram for describing the erasing operation of the memory block according to some embodiments. According to some embodiments, in the erasing operation of the second memory block BLKb described in FIG. 18, the first time period ters1 to the seventh time period ters7 may be different from each other. For example, the first time period ters1 to the seventh time period ters7 may be sequentially lengthened. This may be attributed to the difference between the erase speed of the memory cells disposed at the relatively lower positions in the vertical stack and the erase speed of the memory cells disposed at the relatively upper positions in the vertical stack.

Figure 20:
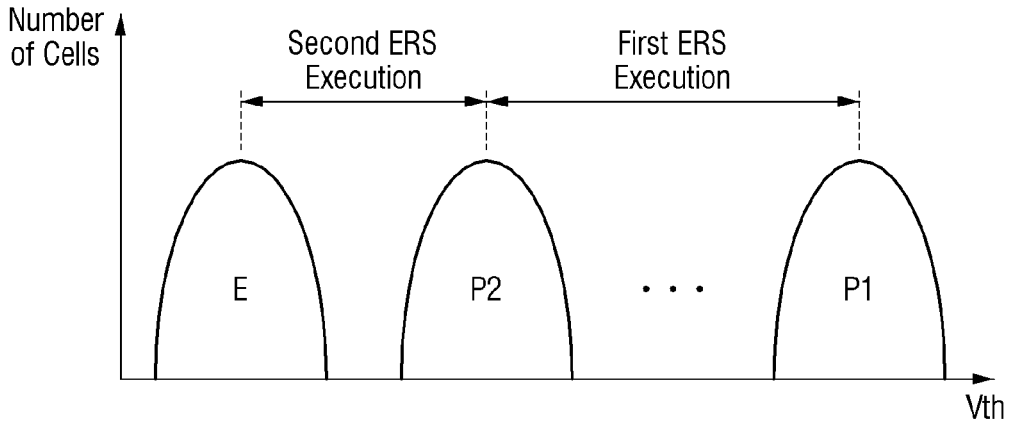
FIG. 20 is an example diagram for illustrating a first erasing operation and a second erasing operation of the memory block according to some embodiments.

FIG. 20 is an example diagram for illustrating a first erasing operation and a second erasing operation of the memory block according to some embodiments. Referring to FIG. 20, the erasing operation of the memory block according to some embodiments may include two or more erasing operations. For example, the erasing operation of the memory block according to some embodiments may include a first erasing operation (First ERS Execution) and a second erasing operation (Second ERS Execution). Hereinafter, the memory block may mean either the first memory block BLKa or the second memory block BLKb. In FIG. 20, it is assumed that the memory block is in a first program state P1. For example, the memory block may be in the first program state P1 through the pre-program operation, but the embodiments are not limited thereto.

According to some embodiments, the control logic (150 of FIG. 2) may execute the first erasing operation (First ERS Execution) on the memory block. The memory block of the first program state P1 may enter a second program state P2 through the first erasing operation (First ERS Execution). The control logic (150 of FIG. 2) may execute the second erasing operation (Second ERS Execution) on the memory block in which the first erasing operation (First ERS Execution) has been executed. The memory block of the second program state P2 may enter an erase state E through second erasing operation (Second ERS Execution). When the memory block reaches the erase state E, it is assumed that the memory block is successfully is erased.

Figure 21:
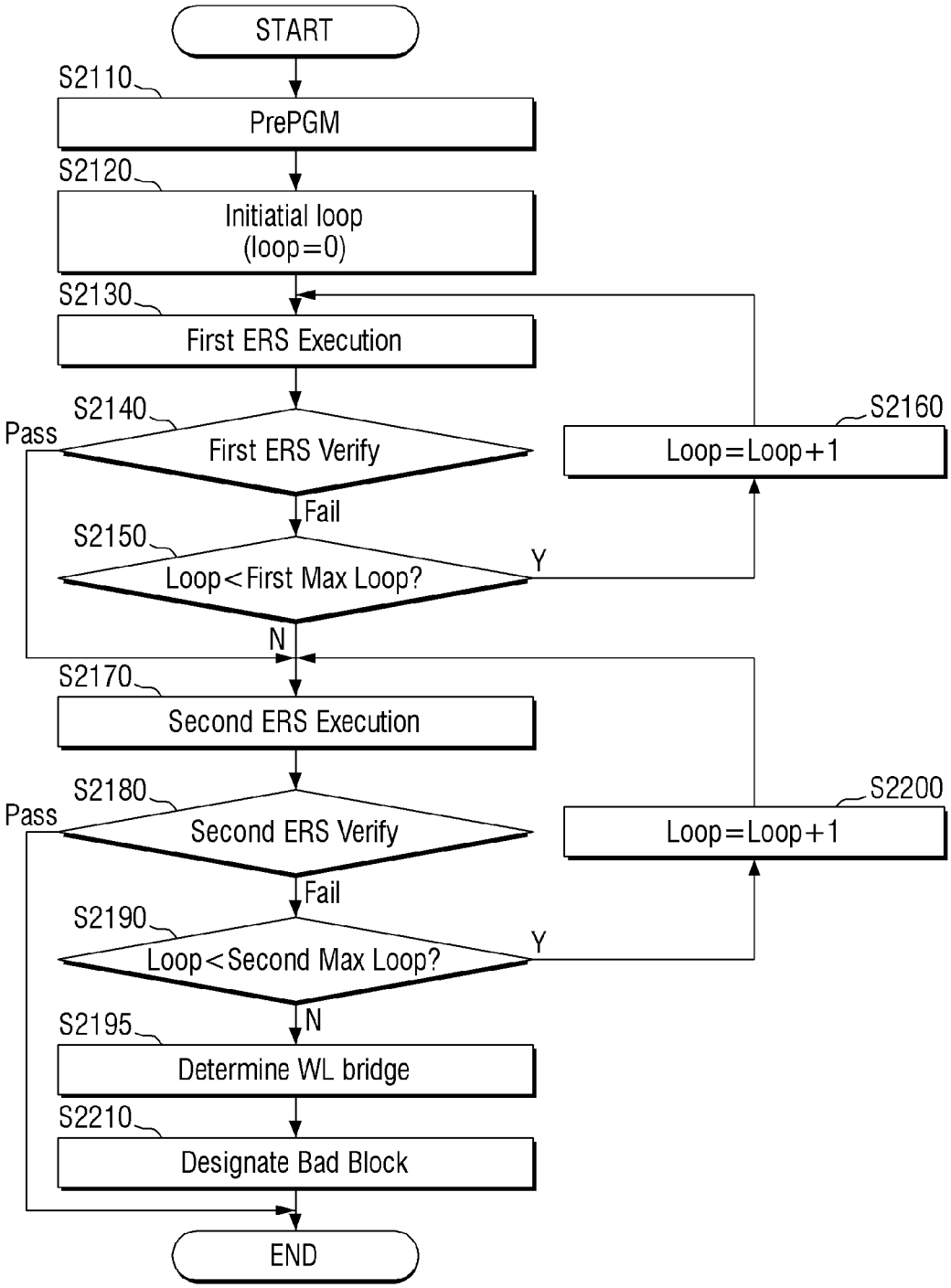
FIG. 21 is an example flowchart for explaining the method for detecting the bridge defect, using the erasing operation on the memory block according to some embodiments.
Figure 22:
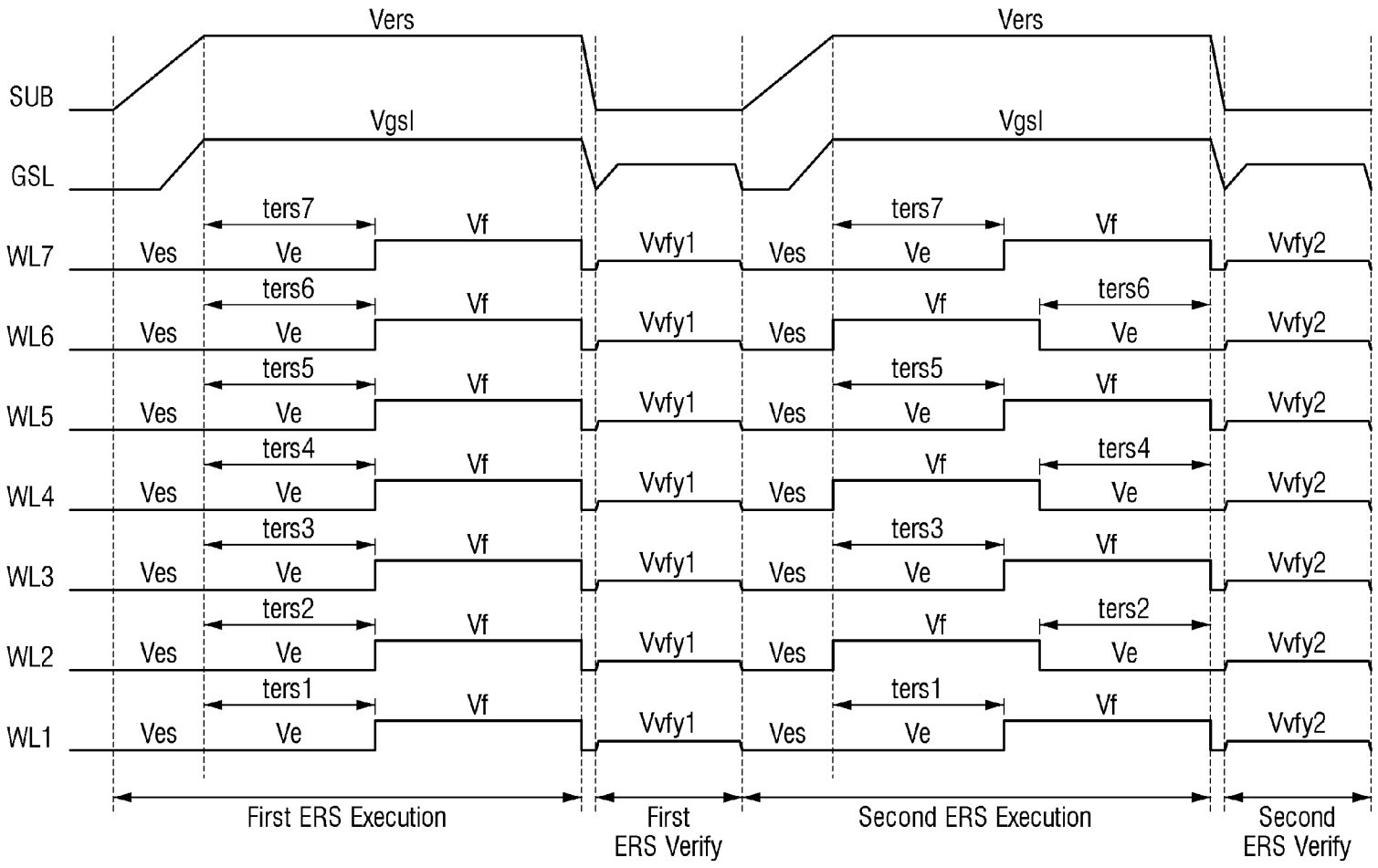
FIG. 22 is an example flowchart for explaining the method for detecting the bridge defect, using the erasing operation of the memory block according to some embodiments.
Figure 23:
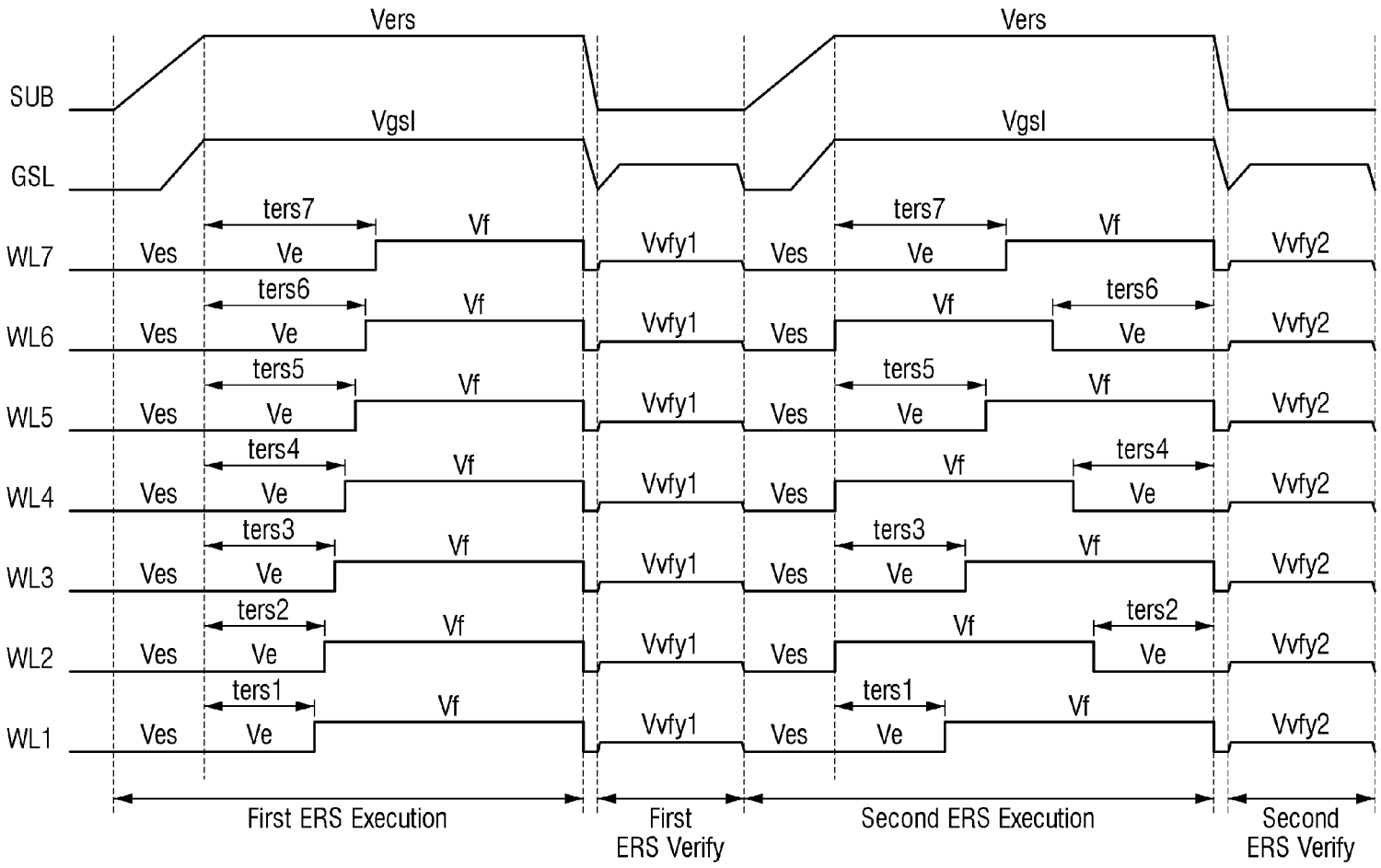
FIG. 23 is an example flowchart for explaining the method for detecting the bridge defect, using the erasing operation on the memory block according to some embodiments.

FIG. 21 is an example flowchart for explaining the method for detecting the bridge defect, using the erasing operation on the memory block according to some embodiments. FIG. 22 is an example flowchart for explaining the method for detecting the bridge defect, using the erasing operation of the memory block according to some embodiments. FIG. 23 is an example flowchart for explaining the method for detecting the bridge defect, using the erasing operation on the memory block according to some embodiments. Steps S2110 and S2120 of FIG. 21 may be similar to steps S710 and S720 of FIG. 7, respectively. Therefore, a further explanation thereof will not be provided.

Referring to FIGS. 21 to 23, the first erasing operation (First ERS Execution) of the memory block is executed (S2130). While the first erasing operation (First ERS Execution) is executed, the erase voltage Ve may be applied to the first word line WL1 to the seventh word line WL7 substantially at the same time. At this time, the first time period ters1 to the seventh time period ters7 for which the erase voltage Ve is applied to the first word line WL1 to the seventh word line WL7 may be substantially the same or different from each other. In other words, the first erasing operation (First ERS Execution) may be an erasing operation on a memory block described with reference to FIGS. 5 and 6, for example. It is verified whether to erase the first memory block (S2140). For example, the control logic (150 of FIG. 2) applies a first verification voltage Vvfy1 to the first word line WL1 to the seventh word line WL7 using the address decoder (120 of FIG. 2), monitors the voltage change of the bit line BL, and may verify whether to perform first erase on the memory block. If the first erase of the memory block is verified as failed, it is determined whether the loop number is less than a predetermined first maximum loop number (S2150). If the loop number is less than the predetermined first maximum loop, 1 is added to the current loop number (S2160), and the first erasing operation (First ERS Execution) on the memory block is executed again (S2130).

When the loop number reaches a predetermined first maximum loop number, or when the first erase of the memory block is verified to be successful, the second erasing operation (Second ERS Execution) on the memory block is executed (S2170). In the second erasing operation (Second ERS Execution), the time at which the erase voltage Ve is applied to at least a part of a group of odd word lines may be different from the time at which the erase voltage Ve is applied to at least a part of a group of even word lines. For example, the time at which the erase voltage Ve is applied to the group of odd word lines may precede the time at which the erase voltage Ve is applied to the group of even word lines. The first time period ters1 to the seventh time period ters7 may be substantially the same as or different from each other. In other words, the second erasing operation (Second ERS Execution) may be an erasing operation on a memory block described with reference to FIGS. 8 and 11, for example. However, the embodiments are not limited thereto, and the second erasing operation (Second ERS Execution) may be an erasing operation on a memory block described with reference to FIGS. 10, 12, 13, and 16 to 19. Those having ordinary skill in the technical field of the present inventive concepts will be able to select the first erasing operation (First ERS Execution) and the second erasing operation (Second ERS Execution) in various combinations.

It is verified whether to erase the second memory block (S2180). For example, the control logic (150 of FIG. 2) applies the second verification voltage Vvfy to the first word line WL1 to the seventh word line WL7, using the address decoder (120 of FIG. 2), monitors the voltage change of the bit line BL, and may verify whether to perform the second erase of the memory block. If the second erase of the memory block is verified as having failed, it is determined whether the loop number is less than a predetermined second maximum loop number (S2190). If the loop is smaller than the predetermined second maximum loop number, 1 is added to the current loop number (S2200), and the second erasing operation on the memory block is executed again (S2170). When the loop number reaches the predetermined second maximum loop number, the control logic 150 determines that a word line bridge defect exists in the memory block (S2195), and sets the memory block as a bad block (S2210). Thereafter, the second erasing operation (Second ERS Execution) on the memory block is terminated. On the other hand, if the second erase on the memory block is verified to be successful (S2180), then the second erasing operation (Second ERS Execution) on the memory block is terminated.

In concluding the detailed description, those skilled in the art will appreciate that many variations and modifications may be made to the preferred embodiments without substantially departing from the principles of the present inventive concepts. Therefore, the disclosed preferred embodiments of the inventive concepts are used in a generic and descriptive sense only and not for purposes of limitation.

What is claimed is:

1. A memory device comprising:

a first memory cell, and a second memory cell different from the first memory cell and disposed above or below the first memory cell, wherein the first memory cell and the second memory cell are included in a same memory block as each other;

a first word line connected to the first memory cell;

a second word line, different from the first word line, connected to the second memory cell;

an address decoder which is configured to apply one of an erase voltage and an inhibit voltage different from the erase voltage to each of the first and second word lines; and a control logic which is configured to control an erasing operation on the memory block, using the address decoder, wherein while the erasing operation on the memory block is executed, the inhibit voltage is applied to the first word line after the erase voltage is applied, and the erase voltage is applied to the second word line after the inhibit voltage is applied, and wherein the erase voltage is applied to the first word line for a first time period, and the erase voltage is applied to the second word line for a second time period which is longer than or shorter than the first time period.

2. The memory device of claim 1, wherein the second memory cell is disposed above the first memory cell.

3. The memory device of claim 2, wherein the erase voltage is applied to the first word line for a first time period, and the erase voltage is applied to the second word line for a second time period longer than the first time period.

4. The memory device of claim 2, further comprising:

a third memory cell, different from the first and second memory cells, which is included in the memory block and disposed above the second memory cell;

a fourth memory cell, different from the first to third memory cells, which is included in the memory block and disposed above the third memory cell;

a third word line, different from the first and second word lines, connected to the third memory cell[and]; and a fourth word line, different from the first to third word lines, connected to the fourth memory cell[and], wherein the address decoder is configured to apply one of the erase voltage and the inhibit voltage to each of the third and fourth word lines, and wherein while the erasing operation on the memory block is executed, the inhibit voltage is applied to the third word line and the fourth word line after the erase voltage is applied.

5. The memory device of claim 2, further comprising:

a third memory cell, different from the first and second memory cells, which is included in the memory block and disposed above the second memory cell;

a fourth memory cell, different from the first to third memory cells, which is included in the memory block and disposed above the third memory cell;

a third word line, different from the first and second word lines, connected to the third memory cell; and a fourth word line, different from the first to third word lines, connected to the fourth memory cell, wherein the address decoder is configured to apply one of the erase voltage and the inhibit voltage to each of the third and fourth word lines, and wherein while the erasing operation on the memory block is executed, the inhibit voltage is applied to the third word line after the erase voltage is applied, and the erase voltage is applied to the fourth word line after the inhibit voltage is applied.

6. The memory device of claim 1, wherein the first memory cell is disposed above the second memory cell.

7. The memory device of claim 6, wherein the erase voltage is applied to the first word line for a first time period, and the erase voltage is applied to the second word line for a second time period which is less than the first time period.

8. The memory device of claim 1, wherein the memory block includes a first memory structure and a second memory structure stacked vertically together, and wherein the first memory structure includes the first memory cell and the second memory cell, and a height of the first memory structure is greater than a height of the second memory structure.

9. The memory device of claim 8, further comprising:

a third memory cell, different from the first and second memory cells, included in the memory block;

a fourth memory cell, different from the first to third memory cells, which is included in the memory block;

a third word line, different from the first and second word lines, connected to the third memory cell; and a fourth word line, different from the first to third word lines, connected to the fourth memory cell, wherein the second memory structure includes the third memory cell and the fourth memory cell, wherein the address decoder is configured to apply one of the erase voltage and the inhibit voltage to each of the third and fourth word lines, and wherein when the erasing operation on the memory block is executed, the inhibit voltage is applied to the third word line and the fourth word line after the erase voltage is applied.

10. The memory device of claim 1, further comprising:

a third memory cell, different from the first and second memory cells, which is included in the memory [blocks] *block*;

*a* fourth memory cell, different from the first to third memory cells, which is included in the memory block;

a third word line, different from the first and second word lines, connected to the third memory cell; and a fourth word line, different from the first to third word lines, connected to the fourth memory cell, wherein the memory block includes a first memory structure and a second memory structure on the first memory structure, wherein the first memory structure includes the first and second memory cells, and the second memory structure includes the third and fourth memory cells, wherein the address decoder is configured to apply one of the erase voltage and the inhibit voltage to each of the third and fourth word lines, and wherein when the erasing operation on the memory block is executed, the inhibit voltage is applied to the third word line after the erase voltage is applied, and the erase voltage is applied to the fourth word line after the inhibit voltage is applied.

11. The memory device of claim 1, wherein the address decoder is configured to apply the inhibit voltage to the first word line by floating the first word line, and to apply the inhibit voltage to the second word line by floating the second word line.

12. A memory device, comprising:

a first memory cell and a second memory cell different from the first memory cell, wherein the first memory cell and the second memory cell are included in a same memory block as each other;

a first word line connected to the first memory cell, and a second word line, different from the first word line, connected to the second memory cell;

an address decoder connected to the first and second word lines; and a control logic which is configured to control the address decoder to execute an erasing operation of the memory block and an erasing verification operation of the memory block, wherein the control logic is configured to execute a first erasing operation on the memory block to apply one of an erase voltage and an inhibit voltage different from the erase voltage to each of the first and second word lines, and to execute a first erasing verification operation on the memory block to verify whether the memory block is erased, wherein while the first erasing operation is executed, the inhibit voltage is applied to the second word line during at least a part of a time section in which the erase voltage is applied to the first word line, and the inhibit voltage is applied to the first word line during at least another part of the time section in which the erase voltage is applied to the second word line, and wherein the control logic is configured to determine that a word line bridge defect exists in the memory block in response to the erase of the memory block being determined to be failed as a result of the execution of the first erasing verification operation.

13. The memory device of claim 12, wherein the control logic is configured to execute a second erasing operation on the memory block to apply one of the erase voltage and the inhibit voltage to each of the first and second word lines, and to execute a second erasing verification operation on the memory block to verify whether the memory block is erased, and wherein the first erasing operation is executed irrespective of whether the memory block is erased after the second erasing verification operation is executed.

14. The memory device of claim 13, wherein, when the second erasing operation is performed, a time point at which the erase voltage is applied to the first word line is substantially identical to a time point at which the erase voltage is applied to the second word line.

15. The memory device of claim 12, wherein the erase voltage is applied to the first word line for a first time period, and the erase voltage is applied to the second word line for a second time period different from the first time period.

16. The memory device of claim 12, further comprising:

a third memory cell, different from the first and second memory cells, included in the memory block, a fourth memory cell, different from the first to third memory cells, included in the memory block;

a third word line, different from the first and second word lines, connected to the third memory cell; and a fourth word line, different from the first to third word lines, connected to the fourth memory cell, the address decoder being connected to the third and fourth word lines, wherein the control logic is further configured to execute the first erasing operation to apply either the erase voltage or the inhibit voltage to each of the third and fourth word lines, and wherein while the first erasing operation is executed, a first time point at which the erase voltage is applied to the third word line is different from a second time point at which the erase voltage is applied to the fourth word line.

17. The memory device of claim 12, further comprising:

A third memory cell, different from the first and second memory cell, included in the memory [blocks] *block*;

a fourth memory cell, different from the first to third memory cells, included in the memory block;

a third word line, different from the first and second word lines, connected to the third memory cell; and a fourth word line, different from the first to third word lines, connected to the fourth memory cell, wherein the address decoder is connected to the third and fourth word lines, wherein the control logic is further configured to execute the first erasing operation to apply either the erase voltage or the inhibit voltage to each of the third and fourth word lines, and wherein while the first erasing operation is executed, a first time point at which the erase voltage is applied to the third word line is different from a second time point at which the erase voltage is applied to the fourth word line.

18. The memory device of claim 17, wherein the third and fourth memory cells are disposed above the first and second memory cells.

19. A memory device, comprising:

a plurality of memory cells, different from each other, included in a same memory block;

a plurality of word lines, different from each other, connected to each of the plurality of memory cells;

an address decoder which is configured to apply one of an erase voltage and an inhibit voltage different from erase voltage to each of the plurality of word lines; and a control logic which is configured to control when the address decoder applies the erase voltage to the plurality of word lines, and to control when the address decoder applies the inhibit voltage to the plurality of word lines, wherein the plurality of word lines includes a group of even word lines and a group of odd word lines, and wherein a first time duration during which the erase voltage is applied to at least a portion of the group of [the] even word lines is longer than or shorter than a second time duration during which the erase voltage is applied to at least a portion of the group of odd word lines.

20. The memory device of claim 19, wherein the first time duration is before or after the second time duration.

*21. The memory device of claim 1, wherein the address decoder is configured to apply only the erase voltage of the erase voltage and the inhibit voltage to each of the first and second word lines.*

* * * * *